(12) United States Patent
Cheng et al.

(10) Patent No.: US 12,557,610 B2
(45) Date of Patent: Feb. 17, 2026

(54) MULTILAYER ISOLATION STRUCTURE FOR HIGH VOLTAGE SILICON-ON-INSULATOR DEVICE

(71) Applicant: Taiwan Semiconductor Manufacturing Co., Ltd., Hsin-Chu (TW)

(72) Inventors: Yu-Hung Cheng, Tainan (TW); Yu-Chun Chang, Tainan (TW); Ching I Li, Tainan (TW); Ru-Liang Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/336,137

(22) Filed: Jun. 16, 2023

(65) Prior Publication Data

US 2023/0326787 A1 Oct. 12, 2023

Related U.S. Application Data

(62) Division of application No. 17/232,618, filed on Apr. 16, 2021, now Pat. No. 11,682,578.

(Continued)

(51) Int. Cl.
*H01L 21/762* (2006.01)
*H01L 21/02* (2006.01)
*H10D 86/00* (2025.01)

(52) U.S. Cl.
CPC .. *H01L 21/76283* (2013.01); *H01L 21/76286* (2013.01); *H10D 86/201* (2025.01);

(Continued)

(58) Field of Classification Search
CPC ......... H01L 21/76283; H01L 21/76286; H01L 27/1203; H01L 21/02381; H01L 21/0245;

(Continued)

(56) References Cited

U.S. PATENT DOCUMENTS 7,679,130 B2   3/2010  Tilke et al.
9,905,638 B1 * 2/2018  Tominari .......... H01L 21/30604
(Continued)

FOREIGN PATENT DOCUMENTS

CN   101019232 A   8/2007
CN   106409679 A   2/2017
(Continued)

*Primary Examiner* — Julia Slutsker
(74) *Attorney, Agent, or Firm* — HAYNES AND BOONE, LLP

(57) ABSTRACT

Deep trench isolation structures for high voltage semiconductor-on-insulator devices are disclosed herein. An exemplary deep trench isolation structure surrounds an active region of a semiconductor-on-insulator substrate. The deep trench isolation structure includes a first insulator sidewall spacer, a second insulator sidewall spacer, and a multilayer silicon-comprising isolation structure disposed between the first insulator sidewall spacer and the second insulator sidewall spacer. The multilayer silicon-comprising isolation structure includes a top polysilicon portion disposed over a bottom silicon portion. The bottom polysilicon portion is formed by a selective deposition process, while the top polysilicon portion is formed by a non-selective deposition process. In some embodiments, the bottom silicon portion is doped with boron.

20 Claims, 10 Drawing Sheets

Related U.S. Application Data

(60) Provisional application No. 63/059,089, filed on Jul. 30, 2020.

(52) U.S. Cl.
CPC .... *H01L 21/02381* (2013.01); *H01L 21/0245* (2013.01); *H01L 21/02488* (2013.01); *H01L 21/02505* (2013.01); *H01L 21/02532* (2013.01); *H01L 21/02579* (2013.01); *H01L 21/0262* (2013.01); *H01L 21/02636* (2013.01)

(58) Field of Classification Search
CPC ......... H01L 21/02488; H01L 21/02505; H01L 21/02532
See application file for complete search history.

(56) References Cited

U.S. PATENT DOCUMENTS

| | | | |
|---|---|---|---|
| 9,941,350 | B1 | 4/2018 | Lin et al. |
| 2005/0221547 | A1* | 10/2005 | Yamauchi ........... H01L 29/7811 |
| | | | 257/E21.629 |
| 2007/0281436 | A1 | 12/2007 | Sadaka et al. |
| 2007/0298593 | A1 | 12/2007 | Yu et al. |
| 2008/0012090 | A1 | 1/2008 | Meiser et al. |
| 2012/0009740 | A1 | 1/2012 | Cheng et al. |
| 2013/0001682 | A1 | 1/2013 | Tang et al. |
| 2013/0105796 | A1* | 5/2013 | Liu .................... H01L 21/02576 |
| | | | 257/52 |
| 2015/0255537 | A1* | 9/2015 | Pigott ................. H01L 27/0676 |
| | | | 438/424 |
| 2016/0163583 | A1 | 6/2016 | Liu et al. |
| 2016/0247801 | A1 | 8/2016 | Huang et al. |
| 2016/0293614 | A1 | 10/2016 | Zhang |
| 2016/0307999 | A1 | 10/2016 | Kim |
| 2016/0308007 | A1* | 10/2016 | Hu ..................... H01L 21/02164 |
| 2018/0358257 | A1* | 12/2018 | Enda .................. H01L 29/1087 |
| 2022/0028727 | A1* | 1/2022 | Fuchs ............... H01L 29/66068 |

FOREIGN PATENT DOCUMENTS

| | | |
|---|---|---|
| CN | 109309051 A | 2/2019 |
| EP | 0469583 A2 | 2/1992 |
| KR | 20020055883 A | 7/2002 |
| TW | 201907563 A | 2/2019 |

\* cited by examiner

MULTILAYER ISOLATION STRUCTURE FOR HIGH VOLTAGE SILICON-ON-INSULATOR DEVICE

This application is a divisional application of U.S. patent application Ser. No. 17/232,618, filed Apr. 16, 2021, which is a non-provisional application of and claims benefit of U.S. Provisional Patent Application Ser. No. 63/059,089, filed Jul. 30, 2020, the entire disclosures of which are incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs. For example, crosstalk has become a significant challenge as more IC devices, circuits, and/or systems having multiple functionalities are being densely packed onto a single substrate to meet advanced IC technology demands. Often, crosstalk arises from capacitive, inductive, and/or conductive coupling between IC devices and/or IC components on the same substrate. Semiconductor-on-insulator (SOI) technology has been implemented to improve isolation and suppress crosstalk between IC devices and/or IC components. In SOI technology, IC devices are fabricated on a semiconductor-insulator-semiconductor substrate, such as a silicon layer-oxide layer-silicon layer substrate, instead of a bulk semiconductor substrate. Additional isolation structures, such as shallow trench isolation structures and/or deep trench isolation structures, are often further incorporated into SOI substrates to further improve isolation and suppress crosstalk. Although existing isolation structures implemented in SOI substrates have been generally adequate for their intended purposes, they have not been entirely satisfactory in all respects and improvements are needed as IC technologies scale.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
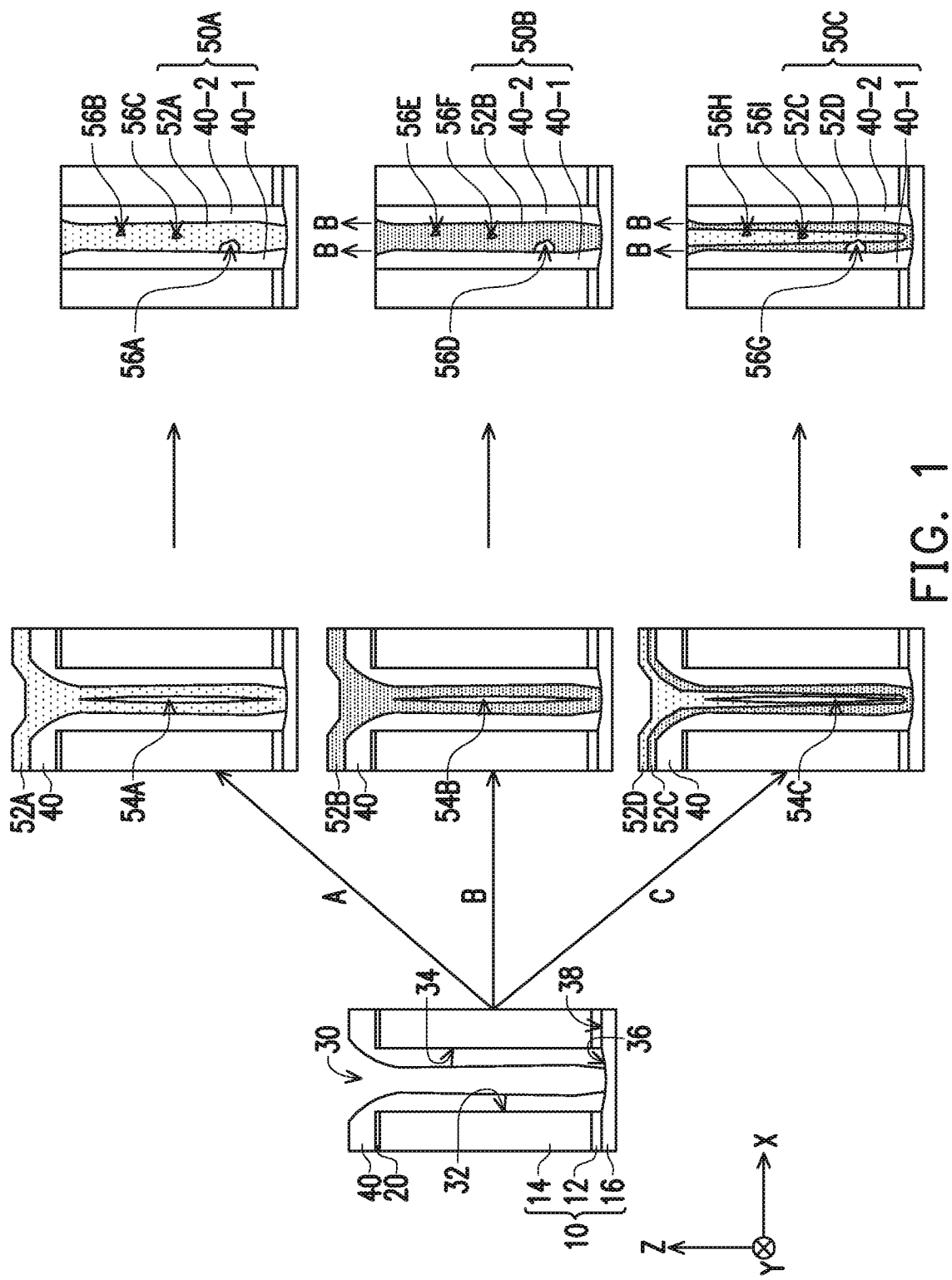
FIG. 1 depicts fragmentary cross-sectional views of fabrication of three different polysilicon isolation features, in portion or entirety, that can be integrated into a semiconductor-on-insulator substrate according to various aspects of the present disclosure.

The present disclosure relates generally to integrated circuit devices, and more particularly, to isolation structures for integrated circuit devices, such as deep trench isolation structures for high voltage silicon-on-insulator devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Crosstalk arises from capacitive, inductive, and/or conductive coupling between integrated circuit (IC) devices and/or IC components on the same substrate. Semiconductor-on-insulator (SOI) technology has been implemented to improve isolation and suppress crosstalk between IC devices and/or IC components. In SOI technology, IC devices are fabricated on a semiconductor-insulator-semiconductor substrate, such as a silicon layer-oxide layer-silicon layer substrate, instead of a bulk semiconductor substrate. Additional isolation structures, such as shallow trench isolation structures (STIs) and/or deep trench isolation structures (DTIs), are often further incorporated into SOI substrates to further improve isolation and suppress crosstalk. FIG. 1 depicts fragmentary cross-sectional views of fabrication of three different polysilicon DTIs, in portion or entirety, that can be integrated into SOI substrates according to various aspects of the present disclosure. In FIG. 1, fabrication of each of the polysilicon DTIs begins with receiving an SOI substrate 10 (including, for example, an insulator layer 12 disposed between a semiconductor layer 14 and a semiconductor layer 16) and forming a patterning layer 20 over SOI substrate 10, where patterning layer 20 has an opening therein that exposes a portion of SOI substrate 10. Patterning layer 20 can include a pad layer and a mask layer, where the pad layer is disposed on semiconductor layer 14 and the mask layer is disposed on the pad layer. In some embodiments, the pad layer includes silicon and oxygen, and the mask layer includes silicon and nitrogen. For example, the pad layer is a silicon oxide layer formed by thermal oxidation and/or other suitable process, and the mask layer is a silicon nitride layer or a silicon oxynitride layer formed by chemical vapor deposition (CVD), low pressure CVD (LPCVD), plasma enhanced CVD (PECVD), thermal nitridation (for example, of silicon), other suitable process, or combinations thereof. In some embodiments, the pad layer includes a material that can promote adhesion between SOI substrate 105 and the mask layer and can further act as an etch stop layer when removing the mask layer. Other materials for and/or methods for forming the pad layer and/or the mask layer are contemplated by the present disclosure.

The opening is formed in the mask layer and the pad layer by performing a lithography process to form a patterned resist layer over patterning layer 20 and performing an etching process to transfer a pattern formed in the patterned resist layer to patterning layer 20. The lithography process can include forming a resist layer on the mask layer (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of the mask layer and the pad layer, thereby forming the opening that extends through patterning layer 20. The etching process can include a dry etching process (for example, a reactive ion etching (RIE) process), a wet etching process, other suitable etching process, or combinations thereof. After the etching process, the patterned resist layer can be removed, for example, by a resist stripping process. Alternatively, the exposure process can implement maskless lithography, electron-beam writing, and/or ion-beam writing.

An isolation trench etching process is then performed using patterning layer 20 as an etch mask to form an isolation trench 30 in SOI substrate 10. Portions of SOI substrate 10 exposed by the opening in patterning layer 20 are removed by the isolation trench etching process, such that isolation trench 30 extends through semiconductor layer 14 and insulator layer 12 to expose semiconductor layer 16. Isolation trench 30 has a sidewall 32 formed by semiconductor layer 14 and insulator layer 12, a sidewall 34 formed by semiconductor layer 14 and insulator layer 12, and a bottom 36 formed by semiconductor layer 16. In FIG. 1, the isolation trench etching process slightly etches semiconductor layer 16, such that bottom 36 is formed by a recessed, curved surface of semiconductor layer 16, which extends below a topmost surface 38 of semiconductor layer 16. Isolation trench 30 is a high aspect ratio trench, which generally refers to a trench having one dimension that is substantially greater than another dimension. For example, isolation trench 30 has a depth defined along a z-direction and a width w defined along an x-direction, where depth d is substantially greater than width w. In some embodiments, a ratio of depth d to width w is greater than about 5. The isolation trench etching process is a dry etching process, a wet etching process, or combinations thereof.

Fabrication then proceeds with depositing an oxide layer 40 over SOI substrate 10 and patterning layer 20, where oxide layer 40 partially fills isolation trench 30. After deposition, oxide layer 40 covers patterning layer 20 and further covers sidewall 32, sidewall 34, and bottom 36 of isolation trench 30. An etching process is then performed that removes oxide layer 40 from bottom 36 of isolation trench 30. After the etching process, oxide layer 40 covers sidewall 32 and sidewall 34 of isolation trench 30 but not a portion of bottom 36 of isolation trench 30. Any suitable deposition process is implemented for forming oxide layer 40, such as CVD, physical vapor deposition (PVD), atomic layer deposition (ALD), high density plasma CVD (HDPCVD), metal organic CVD (MOCVD), remote plasma CVD (RPCVD), rapid thermal CVD (RTCVD), PECVD, plasma enhanced ALD (PEALD), LPCVD, atomic layer CVD (ALCVD), atmospheric pressure CVD (APCVD), other suitable methods, or combinations thereof. In the depicted embodiment, oxide layer 40 is formed by a high aspect ratio deposition process (HARP), such as HDPCVD. HARP generally refers to a deposition process that can achieve adequate filling of high aspect ratio structures, such as high aspect ratio trenches, such as isolation trench 30. The etching process is an anisotropic etch process, which generally refers to an etch process having different etch rates in different directions, such that the etch process removes material in specific directions, such as substantially in one direction. For example, the etching has a vertical etch rate that is greater than a horizontal etch rate (in some embodiments, the horizontal etch rate equals zero). The anisotropic etch process thus removes material in substantially the vertical direction (here, z-direction) with minimal (to no) material removal in the horizontal direction (here, x-direction and/or y-direction). In such embodiments, the anisotropic etch does not remove, or minimally removes, oxide layer 40 covering sidewall 32 and sidewall 34 of isolation trench 30 and may partially or completely remove oxide layer 40 covering patterning layer 20. In some embodiments, a thickness of oxide layer 40 at upper corners of isolation trench 30 may be slightly reduced by the anisotropic etch process, such as depicted in FIG. 1. In some embodiments, a thickness of oxide layer 40 covering patterning layer 20 is reduced by the anisotropic etch process. The anisotropic etch process can be a dry etching process, a wet etching process, or combinations thereof. In some embodiments, the etching process is a dry etching process, such as a reactive ion etching (RIE) process.

Fabrication can then proceed with process A to form a polysilicon DTI 50A, process B to form a polysilicon DTI 50B, or process C to form a polysilicon DTI 50C. Process A includes depositing a polysilicon layer 52A over oxide layer 40 to fill a remainder of isolation trench 30 and performing a planarization process to remove portions of polysilicon layer 52A disposed over oxide layer 40, such that a top surface of polysilicon layer 52A and a top surface of oxide layer 40 are substantially planar. A planarization process is then performed (or the planarization process is continued) to remove portions of oxide layer 40 disposed over patterning layer 20, such that the top surface of polysilicon layer 52A, the top surface of oxide layer 40, and the top surface of patterning layer 20 are substantially planar. Thereafter, patterning layer 20 is removed from over SOI substrate 10. Polysilicon DTI 50A thus has an oxide sidewall 40-1 (i.e., a remainder of oxide layer 40 disposed along sidewall 32 of isolation trench 30), an oxide sidewall 40-2 (i.e., a remainder of oxide layer disposed along sidewall 34 of isolation trench 30), and polysilicon layer 52A disposed between oxide sidewall 40-1 and oxide sidewall 40-2. Polysilicon layer 52A physically contacts semiconductor layer 16 of SOI substrate 10. Polysilicon layer 52A includes polycrystalline silicon, which is also referred to as multi-crystalline silicon or polysilicon. Polycrystalline silicon generally includes multiple silicon grains (crystals) separated by grain boundaries (i.e., grains of monocrystalline silicon, which can be oriented randomly and have different crystal orientations).

In process A, polysilicon layer 52A is formed by a non-selective deposition process, which generally refers to a deposition process that forms material indiscriminately over various surfaces, such as dielectric surfaces, semiconductor surfaces, and metal surfaces. For example, polysilicon layer 52A is formed by CVD, HDPCVD, LPCVD, RTCVD, or ALD. Because of the high aspect ratio of isolation trench 30 (and thus narrow width of isolation trench 30), polysilicon material formed by the non-selective deposition process may fill or close (pinch) off a top of isolation trench 30 before completely filling isolation trench 30, resulting in polysilicon layer 52A having a seam (void) 54A that runs vertically through a center of poly silicon layer 52A after deposition. During subsequent processing, such as that associated with fabricating an IC device (e.g., a transistor) on SOI substrate 10, polysilicon DTI 50A (and thus polysilicon layer 52A) may be exposed to various high temperature processes, such as high temperature annealing processes. High temperatures (e.g., temperatures greater than about 1000° C.) can cause thermal migration, growth, and/or recrystallization of the silicon grains of polysilicon layer 52A, thereby changing a grain structure of polysilicon layer 52A. For example, in FIG. 1, a grain structure of polysilicon layer 52A changes during subsequent processing, resulting in polysilicon layer 52A having a void 56A, a void 56B, and a void 56C. Void 56A, void 56B, and/or void 56B may have a dimension (e.g., width, length, or height) that is about 0.3 µm to about 0.5 µm. Voids 56A-56C can cause an IC device isolated by polysilicon DTI 50A to exhibit higher resistance than an IC device isolated by a polysilicon DTI having a polysilicon layer without such voids. The IC device isolated by polysilicon DTI 50A may thus exhibit increased resistance-capacitance (RC) delay and decreased device reliability. In some embodiments, a void may form at a top of polysilicon DTI 50A and filled with metal during subsequent processing, which can diminish reliability of the IC device and/or cause an electrical short circuit.

Introducing dopants, such as boron, into the non-selectively deposited polysilicon layer can reduce resistance and minimize effects of voids in a polysilicon DTI. For example, process B is similar to process A, except process B introduces dopants into the polysilicon material during the non-selective deposition process, such as p-type dopants (e.g., boron, indium, other p-type dopant, or combinations thereof), n-type dopants (e.g., phosphorous, arsenic, other n-type dopant, or combinations thereof), or combinations thereof. In FIG. 1, process B introduces boron into the polysilicon material, thereby forming a boron-doped polysilicon layer 52B. Polysilicon DTI 50B thus has oxide sidewall 40-1, oxide sidewall 40-2, and boron-doped polysilicon layer 52B disposed between oxide sidewall 40-1 and oxide sidewall 40-2. Because of the high aspect ratio of isolation trench 30 and subsequent high temperature processing, polysilicon DTI 50B also includes a seam 54B and voids 56D-56F, similar to seam 54A and voids 56A-56C, respectively, of polysilicon DTI 50A. Incorporating dopants into polysilicon DTI 50B (i.e., boron-doped polysilicon layer 52B) can offset or minimize resistance increases caused by voids 56D-56F. In some embodiments, an IC device isolated by polysilicon DTI 50B exhibits less resistance than an IC device isolated by polysilicon DTI 50A. In some embodiments, incorporating boron into a polysilicon DTI can reduce resistance by as much as three times compared a polysilicon DTI without boron doping. However, as depicted in FIG. 1, outgassing (out-diffusion) of the boron dopants into ambient and/or unintended layers during subsequent processing can also undesirably alter IC device characteristics.

Process C can reduce resistance and minimize effects of voids in a polysilicon DTI, while also minimizing dopant outgassing. Process C is similar to process A and process B, except process C deposits a boron-doped polysilicon layer 52C over oxide layer 40, where boron-doped polysilicon layer 52C partially fills isolation trench 30, and then deposits a polysilicon layer 52D over boron-doped polysilicon layer 52C, where polysilicon layer 52D fills a remainder of isolation trench 30. Boron-doped polysilicon layer 52C and polysilicon layer 52D are formed by non-selective deposition processes, such as described above. Polysilicon DTI 50C thus has oxide sidewall 40-1, oxide sidewall 40-2, and a bi-layer polysilicon layer (i.e., boron-doped polysilicon layer 52C and polysilicon layer 52D) disposed between oxide sidewall 40-1 and oxide sidewall 40-2. Boron-doped polysilicon layer 52C separates polysilicon layer 52D from oxide sidewall 40-1, oxide sidewall 40-2, and semiconductor layer 16. In FIG. 1, boron-doped polysilicon layer 52C and polysilicon layer 52D have substantially u-shaped profiles in an x-z plane. Because of the high aspect ratio of isolation trench 30 and subsequent high temperature processing, polysilicon DTI 50C also includes a seam 54C and voids 56G-56I, similar to seams 54A, 54B and voids 56A-56C, 56D-56F, respectively, of polysilicon DTIs 50A, 50B. Incorporating dopants into polysilicon DTI 50C (i.e., boron-doped polysilicon layer 52C) can offset or minimize resistance increases caused by voids 56G-56I, such that an IC device isolated by polysilicon DTI 50C exhibits less resistance than an IC device isolated by polysilicon DTI 50A. The bi-layer polysilicon layer of polysilicon DTI 50C can also exhibit less dopant outgassing compared to polysilicon DTI 50B. However, as depicted in FIG. 1, some outgassing (out-diffusion) of the boron dopants into ambient and/or unintended layers during subsequent processing still occurs and can undesirably alter IC device characteristics.

Figure 2:
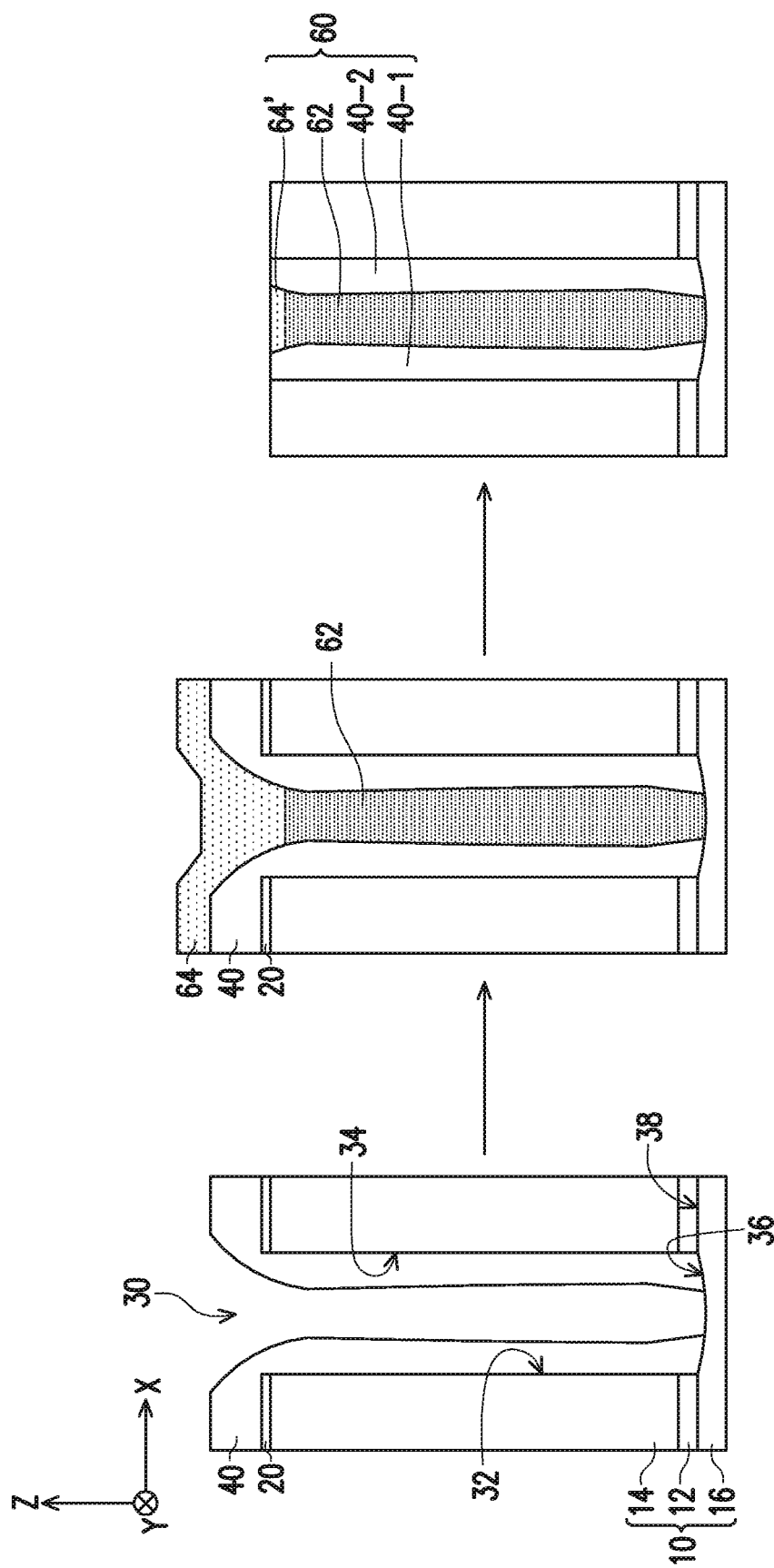
FIG. 2 depicts a fragmentary cross-sectional view of fabrication of a silicon-comprising isolation feature, in portion or entirety, that can be integrated into a semiconductor-on-insulator substrate according to various aspects of the present disclosure.

The present disclosure proposes a silicon-comprising DTI that addresses both void issues and outgassing issues that arise from polysilicon DTIs 50A-50C. Turning to FIG. 2, FIG. 2 depicts a fragmentary cross-sectional view of fabrication of a silicon-comprising DTI 60, in portion or entirety, that can be integrated into an SOI substrate according to various aspects of the present disclosure. In FIG. 2, fabrication of silicon-comprising DTI 60 begins similar to fabrication of polysilicon DTIs 50A-50C. For example, fabrication includes forming patterning layer 20 over SOI substrate 10, forming isolation trench 30 in SOI substrate 10, depositing oxide layer 40 over SOI substrate 10 and patterning layer 20 (where oxide layer 40 is disposed along sidewalls and bottom of isolation trench 30 and oxide layer 40 partially fills isolation trench 30), and removing oxide layer 40 from bottom 36 of isolation trench 30, such as described above. In contrast to fabrication of polysilicon DTIs 50A-50C, fabrication of silicon-comprising DTI 60 proceeds according to a process D, where SOI substrate 10 having isolation trench 30 is received in a process chamber and a silicon layer 62 is formed in isolation trench 30. Silicon layer 62 includes monocrystalline silicon, which is also referred to as single crystalline silicon or crystalline silicon. Monocrystalline silicon generally includes a single, continuous silicon crystal having one crystal orientation and no grain boundaries, whereas polycrystalline silicon generally refers to multiple silicon crystals (grains) separated by grain boundaries (i.e., grains of monocrystalline silicon, which can be oriented randomly and have different crystal orientations). In some embodiments, silicon layer 62 includes intrinsic crystalline silicon, which generally refers to undoped or unintentionally doped (UID) silicon. In such embodiments, silicon layer 62 is substantially free of dopants. In some embodiments, silicon layer 62 includes crystalline silicon doped with p-type dopants (e.g., boron, indium, other p-type dopant, or combinations thereof), n-type dopants (e.g., phosphorous, arsenic, other n-type dopant, or combinations thereof), or combinations thereof. For example, silicon layer 62 can include crystalline silicon doped with boron. In some embodiments, silicon layer 62 is a boron-doped silicon layer having a boron dopant concentration of about $1 \times 10^{14}$ dopants/cm$^3$ (cm$^{-3}$) to about $5 \times 10^{20}$ cm$^{-3}$. In some embodiments, a dopant concentration, such as a boron concentration, is substantially the same along a thickness of silicon layer 62. In some embodiments, silicon layer 62 has a gradient dopant concentration, which can gradually increase or decrease along the thickness of silicon layer 62. In some embodiments, silicon layer 62 includes discrete portions having different dopant concentrations, such as a first silicon portion with a first dopant concentration and a second silicon portion with a second dopant concentration that is different than the first dopant concentration. It is noted that silicon layer 62, whether comprised of intrinsic crystalline silicon or doped crystalline silicon, may include crystalline defects, such as dislocation (e.g., an irregularity and/or a disruption in the ordered arrangement of silicon atoms of monocrystalline silicon). A thickness of silicon layer 62 is less than a depth of isolation trench 30. In some embodiments, the thickness of silicon layer 62 is less than a sum of a thickness of semiconductor layer 14 and insulator layer 12, such that a top surface of silicon layer 62 is below a top surface of SOI substrate 10 (e.g., below a top surface of semiconductor layer 14). In some embodiments, the thickness of silicon layer 62 is about 6 μm to about 9 μm.

Silicon layer 62 is formed by a selective, bottom-up deposition process. Bottom-up deposition process generally refers to a deposition process that fills an opening from bottom to top (i.e., a bottom-up fill of isolation trench 30). The selective, bottom-up deposition process avoids unintentional filling of a top of isolation trench 30 before completely filling isolation trench 30 and thus avoids pinch-off issues that cause seams 54A-54C in polysilicon DTIs 50A-50C, respectively. For example, in FIG. 2, silicon layer 62 is seam-free. The bottom-up deposition process is a silicon selective epitaxial growth (SEG) process that selectively deposits (grows) silicon from semiconductor surfaces (e.g., semiconductor layer 16 of SOI substrate 10) while limiting (or preventing) growth of silicon from dielectric surfaces and/or non-semiconductor surfaces (e.g., oxide layer 40). For example, silicon grows from semiconductor layer 16 but does not grow from oxide layer 40, such that silicon layer 62 fills a remainder of a bottom portion of isolation trench 30 without covering a top surface of oxide layer 40 and/or a top surface of patterning layer 20. In some embodiments, the SEG process is a selective CVD process that introduces a silicon-containing precursor and a carrier gas into the process chamber, where the silicon-containing precursor interacts with SOI substrate 10 and oxide layer 40 to form silicon layer 62. The silicon-containing precursor includes silane ($SiH_4$), disilane ($Si_2H_6$), dichlorosilane ($SiH_2Cl_2$) (DCS), trichlorosilane ($SiHCl_3$), silicon tetrachloride ($SiCl_4$), other suitable silicon-containing precursor, or combinations thereof. The carrier gas may be an inert gas, such as a hydrogen-containing gas (e.g., $H_2$), an argon-containing gas (e.g., Ar), a helium-containing gas (e.g., He), a nitrogen-containing gas (e.g., $N_2$), a xenon-containing gas, other suitable inert gas, or combinations thereof. In the depicted embodiment, SOI substrate 10 and oxide layer 40 are exposed to a deposition mixture that includes DCS (silicon-containing precursor) and $H_2$ (carrier gas). Though various parameters of the selective CVD process can be adjusted (tuned) to ensure that the silicon-containing precursor nucleates and grows selectively from and/or quicker from semiconductor layer 16 than oxide layer 40, some silicon material may nucleate and grow on oxide layer 40. To prevent or limit such growth, the selective CVD process further introduces an etchant-containing precursor into the process chamber that can interact with SOI substrate 10, oxide layer 40, and/or silicon material deposited over SOI substrate 10 and/or oxide layer 40. The etchant-containing precursor includes chlorine ($Cl_2$), hydrogen chloride (HCl), other etchant-containing precursor that can achieve desired silicon growth selectivity, or combinations thereof. Because growth of the silicon material on and from oxide layer 40, if any, is largely discontinuous and discrete compared to growth of silicon material on and from semiconductor layer 16, which is likely continuous and merged, the etchant-containing precursor can remove any silicon material from oxide layer 40 faster than silicon material from semiconductor layer 16. The selective CVD process thus simultaneously deposits and etches silicon material but is configured to have a deposition rate that is greater than an etching rate to ensure net deposition of silicon material. In some embodiments, the etchant-containing precursor prevents any nucleation of silicon material on oxide layer 40. In the depicted embodiment, the deposition mixture further includes HCl, which can etch silicon material that nucleates on oxide layer 40 and/or prevent silicon material from nucleating on oxide layer 40, thereby removing and/or preventing growth of silicon material on oxide layer 40. In some embodiments, the selective CVD process further introduces a dopant-containing precursor into the process chamber that can interact with SOI substrate 10, oxide layer 40, and/or silicon material deposited over SOI substrate 10 and/or oxide layer 40. The dopant-containing precursor includes boron (e.g., $B_2H_6$), phosphorous (e.g., $PH_3$), arsenic (e.g., $AsH_3$), other suitable dopant, or combinations thereof. For example, the deposition mixture can further include $B_2H_6$, which facilitates in-situ boron doping of silicon layer 62.

A target silicon growth (deposition) rate and/or silicon growth selectivity is achieved by adjusting (tuning) various parameters of the selective CVD process, such as a silicon-containing precursor flow rate, a carrier gas flow rate, an etchant-containing precursor flow rate, a dopant-containing precursor flow rate, a temperature, a pressure, other selective CVD process parameter, or combinations thereof. In some embodiments, the selective CVD process includes heating SOI substrate 10 to a temperature that is about 800° C. to about 1,050° C. In some embodiments, a pressure maintained in the process chamber during the selective CVD process is about 10 Torr to about 100 Torr. In some embodiments, the selective CVD process is an LPCVD process, where a pressure maintained in the process chamber is less than about 50 Torr. In some embodiments, a duration of the selective CVD process is about 5 minutes to about 20 minutes. In some embodiments, parameters of the selective CVD process are tuned to achieve a silicon growth rate of at least 1 μm/minute (i.e., silicon growth rate ≥1 μm/minute). In some embodiments, a flow rate of the silicon-containing precursor, such as DCS, is about 50 standard cubic centimeters per minute (sccm) to about 200 sccm. In some embodiments, a flow rate of the carrier gas, such as $H_2$, is about 10,000 sccm to about 40,000 sccm. In some embodiments, a flow rate of the etchant-containing precursor, such as HCl, is about 200 sccm to about 500 sccm. In some embodiments, a flow rate of the dopant-containing precursor, such as $B_2H_6$, is about 0.01 sccm to about 1 sccm. In some embodiments, a flow rate of the dopant-containing precursor is controlled to achieve different dopant concentration profiles in silicon layer 62, such as a substantially uniform dopant profile along the thickness of silicon layer 62, a gradient dopant profile (i.e., dopant increase or decreases) along the thickness of silicon layer 62, and/or discretely doped portions of silicon layer 62 (e.g., a lightly-doped silicon portion and a heavily-doped silicon portion). In embodiments where multiple DTIs are concurrently formed across a wafer, a thickness of a silicon layer formed in an isolation trench may vary depending on a location of the isolation trench on the wafer. For example, a first thickness of a silicon layer formed in an isolation trench located at a center of a wafer may be greater than a second thickness of a silicon layer formed in an isolation trench located at an edge of the wafer. The present disclosure thus further contemplates tuning the selective CVD process to minimize variations in silicon layer thicknesses formed in isolation trenches across a wafer, thereby improving thickness uniformity. In some embodiments, a power/temperature ratio implemented during the selective CVD process is tuned to improve thickness uniformity of silicon layers formed in isolation trenches across a wafer. For example, a center power/temperature is adjusted relative to an edge power/temperature to improve thickness uniformity. In some embodiments, reducing the center power/temperature by about 5% relative to the edge power/temperature achieves a center-to-edge thickness uniformity that is less than about 20%. For example, a difference between the first thickness and the second thickness is less than about 20% when the center power/temperature is about 5% less than the edge power/temperature.

Figure 3:
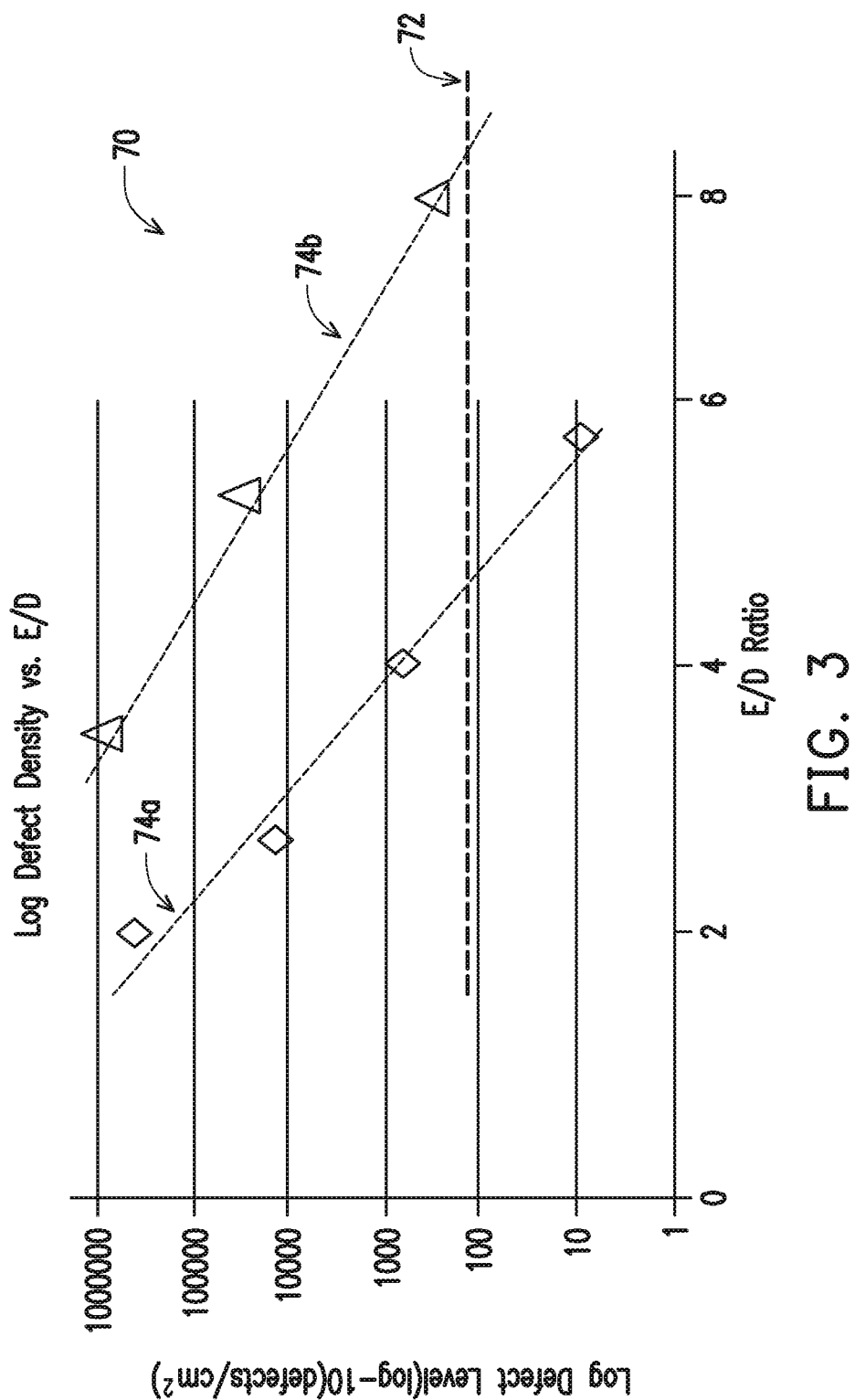
FIG. 3 depicts a log-linear graph that correlates log defect density with an etch/deposition ratio according to various aspects of the present disclosure

In some embodiments, a flow rate of the silicon-containing precursor (D), which dominates a deposition (growth) rate of the silicon material, and a flow rate of the etchant-containing precursor (E), which dominates an etching rate of the silicon material, are tuned to enhance growth kinetics of silicon layer 62. For example, a ratio of the etchant-containing precursor and the silicon-containing precursor (E/D ratio) is tuned to minimize selectivity loss and prevent (or minimize) defects. In some embodiments, defects are silicon nuclei (i.e., silicon material and/or particles) that form on oxide layer 40 during the selective CVD process. Since defect density is inversely proportional to the E/D ratio (e.g., defect density decreases as E/D ratio increases), a flow rate of the etchant-containing precursor (e.g., HCl) can be increased to minimize selectivity loss and/or limit defect density to tolerable levels. For example, FIG. 3 provides a log-linear graph 70 that correlates log defect density with an E/D ratio, where an E/D ratio is represented along an x-axis, a log defect level (in log-10 defects per square centimeter of wafer area ($cm^2$)) is represented along a y-axis, and a tolerable level of defect density is represented by line 72. In the depicted embodiment, the tolerable level of defect density is less than or equal to about 100 (i.e., less than or equal to about 10 defects per $cm^2$ of a wafer). In some embodiments, defect densities above line 72 indicate selectivity loss in a selective CVD process, meaning that silicon material forms not only in trench areas (i.e., on semiconductor layer 16 in isolation trench 30) but also in non-trench areas (i.e., on the top surface of oxide layer 40), while defect densities below line 72 indicate selectivity free in a selective CVD process, meaning that the silicon material forms only in trench areas and not in non-trench areas. In FIG. 3, a line 74a and a line 74b represent log defect density as a function of the E/D ratio for a first silicon trench open ratio (i.e., a ratio of a trench area to a total wafer area) and a second silicon trench open ratio, respectively, where the first silicon trench open ratio is greater than the second silicon trench open ratio. Lines 74a, 74b indicate that defect density decreases as the E/D ratio increases and defect density reaches tolerable levels when the E/D ratio is greater than about 5. Lines 74a, 74b also indicate that the E/D ratios needed to achieve tolerable levels of defect densities increase as silicon trench open ratios decrease. The flow rate of the etchant-containing precursor in the selective CVD process can thus be increased relative to the flow rate of the silicon-containing precursor to increase the E/D ratio and optimize selectivity (i.e., eliminate or minimize selectivity loss and ensure silicon material growth from semiconductor layer 16 but not from oxide layer 40) and minimize defects, but cannot be increased to a level that causes net etching effect. In some embodiments in FIG. 2, the E/D ratio of the selective CVD process is about 5 to about 10 (in other words, 5≤E/D ratio≤10). E/D ratios less than 5 may result in silicon selectivity loss and/or unacceptable defect density levels, while E/D ratios greater than 10 may result in insufficient silicon growth from semiconductor layer 16 (and thus insufficient filling of isolation trench 30) and/or unwanted etching of silicon material from semiconductor surfaces, such as semiconductor layer 16. In some embodiments, reducing defect density and selectivity loss can be achieved by reducing a temperature and pressure of the selective CVD process instead of, or in addition to, increasing the E/D ratio. In some embodiments, heating SOI substrate 10 to a temperature that is about 800° C. to 1,050° C. and maintaining a pressure in the process chamber that is about 10 Torr to about 100 Torr can achieve a silicon growth rate of at least 1 µm/minute and prevent defect density levels from rising above 10 defects/cm$^2$.

Defects on surfaces of oxide layer 40 (e.g., native oxide or other contaminates) can act as nucleation sites from which silicon material can undesirably grow during the silicon SEG process. In some embodiments, a cleaning process is performed before the silicon SEG process to remove defects from oxide layer 40 and/or silicon layer 16, such as any native oxide, contaminates, and/or other defects on oxide layer 40 and/or silicon layer 16. The cleaning process is a baking process performed in an etchant-comprising ambient, where defects are removed (etched) from oxide layer 40 and/or silicon layer 16 during the baking process. For example, the cleaning process can include heating SOI substrate 10 to a cleaning temperature and introducing an etchant-containing precursor and a carrier gas into the process chamber. The etchant-containing precursor includes $Cl_2$, HCl, other etchant-containing precursor that can remove defects, or combinations thereof. The carrier gas includes an inert gas, such as a hydrogen-containing gas, an argon-containing gas, a helium-containing gas, a nitrogen-containing gas, a xenon-containing gas, other suitable inert gas, or combinations thereof. In the depicted embodiment, a chlorine-based pre-baking process, such as an HCl pre-baking process, is performed on oxide layer 40 to remove (clean) surface nucleation sites on oxide layer 40 before forming silicon layer 62. Decreasing surface nucleation sites on oxide layer 40 can decrease defect density associated with forming silicon layer 62.

Process D then proceeds with forming a polysilicon layer 64 over silicon layer 62 and oxide layer 40, where polysilicon layer 64 fills a remaining, upper portion of isolation trench 30. Polysilicon layer 64 includes polycrystalline silicon, such as described herein. Polysilicon layer 64 is undoped or unintentionally doped (i.e., polysilicon layer 64 is substantially free of dopants, and in particular, substantially free of boron dopants). In some embodiments, polysilicon layer 64 includes polysilicon doped with p-type dopants, n-type dopants, or combinations thereof, but a region of polysilicon layer that will form a topmost surface of silicon-comprising DTI 60 is substantially free of dopants. For example, polysilicon layer 64 can include an undoped polysilicon portion and a doped polycrystalline portion, where the undoped polysilicon portion is located at a region of polysilicon layer 64 that forms a topmost surface of silicon-comprising DTI 60. In some embodiments, the doped polysilicon portion includes boron-doped polysilicon. In some embodiments, the boron-doped polysilicon portion has a boron dopant concentration of about $1\times10^{15}$ cm$^{-3}$ to about $5\times10^{20}$ cm$^{-3}$. In some embodiments, polysilicon layer 64 has a gradient boron concentration that decreases from a first boron concentration at an interface between silicon layer 62 and polysilicon layer 64 to a second boron concentration at a top surface of polysilicon layer 64. In some embodiments, the gradient boron concentration decreases from about $5\times10^{20}$ cm$^{-3}$ to about $1\times10^{17}$ cm$^{-3}$. A thickness of polysilicon layer 64 is less than a thickness of silicon layer 62 and sufficient to fill a remainder of isolation trench 30. Any selectivity loss that occurs during formation of silicon layer 62 may result in particles (e.g., silicon particles) forming on oxide layer 40. In some embodiments, these particles are very large, for example, having dimensions as large as 5 µm to 7 µm. To prevent these particles from scratching wafer surfaces during subsequent planarization processes, a thickness of polysilicon layer 64 is sufficient to cover and inhibit movement of these particles. For example, the thickness of polysilicon layer 64 is about 0.5 µm to about 3 µm to ensure coverage of any particles/contamination formed during deposition of silicon layer 62.

Polysilicon layer 64 is formed by a non-selective, blanket deposition process, which generally refers to a deposition process that forms material indiscriminately over various surfaces, such as dielectric surfaces, semiconductor surfaces, and metal surfaces. For example, polysilicon layer 64 covers (blankets) all exposed surfaces, such as the top surface of oxide layer 40 and top surface of silicon layer 62. In some embodiments, the non-selective, blanket deposition process is a blanket CVD process that introduces a silicon-containing precursor and a carrier gas into the process chamber, where the silicon-containing precursor interacts with oxide layer 40 and silicon layer 62 to deposit a polysilicon material that forms polysilicon layer 64. The blanket CVD process does not introduce an etchant-containing precursor, such as HCl, into the process chamber. The silicon-containing precursor includes $SiH_4$, $Si_2H_6$, DCS, $SiHCl_3$, $SiCl_4$, other suitable silicon-containing precursor, or combinations thereof. The carrier gas may be an inert gas, such as a hydrogen-containing gas, an argon-containing gas, a helium-containing gas, a nitrogen-containing gas, a xenon-containing gas, other suitable inert gas, or combinations thereof. In the depicted embodiment, oxide layer 40 and silicon layer 62 are exposed to a deposition mixture that includes DCS (silicon-containing precursor) and $H_2$ (carrier gas). In some embodiments, the blanket CVD process further introduces a dopant-containing precursor into the process chamber that can interact with oxide layer 40, silicon layer 62, and/or deposited polysilicon material. The dopant-containing precursor includes boron, phosphorous, arsenic, other suitable dopant, or combinations thereof. For example, the deposition mixture can further include $B_2H_6$, which facilitates in-situ boron doping of polysilicon layer 64.

Various parameters of the non-selective, blanket deposition process, such as a silicon-containing precursor flow rate, a carrier gas flow rate, a dopant-containing precursor flow rate, a temperature, a pressure, other selective CVD process parameter, or combinations thereof. In some embodiments, the blanket CVD process includes heating SOI substrate 10 to a temperature that is about 650° C. to about 1,000° C. In some embodiments, a pressure maintained in the process chamber during the blanket CVD process is about 10 Torr to about 100 Torr. In some embodiments, a duration of the selective CVD process is about 20 minutes to about 50 minutes. In some embodiments, parameters of the blanket CVD process are tuned to achieve a polysilicon growth rate of at least 0.1 µm/minute (i.e., polysilicon growth rate ≥2 µm/minute). In some embodiments, a flow rate of the silicon-containing precursor, such as DCS, is about 50 sccm to about 300 sccm. In some embodiments, a flow rate of the carrier gas, such as $H_2$, is about 10,000 sccm to about 40,000 sccm. In some embodiments, a flow rate of the dopant-containing precursor, such as $B_2H_6$, is about 0.01 sccm to about 1.0 sccm. In some embodiments, a flow rate of the dopant-containing precursor is controlled to achieve a dopant-free portion of polysilicon layer 64, such as a portion of polysilicon layer 64 that will form a top surface (or region) of silicon-comprising DTI 60. In some embodiments, a flow rate of the dopant-containing precursor is controlled to achieve a gradient dopant concentration in polysilicon layer 64. For example, the flow rate of the dopant-containing precursor is reduced as a thickness of polysilicon layer 64 increases. In some embodiments, the flow rate of the dopant-containing precursor is stopped before polysilicon layer 64 reaches a target thickness.

Thereafter, a planarization process, such as CMP, is performed to remove portions of polysilicon layer 64, portions of oxide layer 40, and patterning layer 22 from over the top surface of SOI substrate 10. A remainder of polysilicon layer 64 forms a polysilicon capping layer 64' of silicon-comprising DTI 60, and a remainder of oxide layer 40 forms oxide sidewall 40-1 and oxide sidewall 40-2 of silicon-comprising DTI 60. At least a top surface (or topmost region) of polysilicon capping layer 64 is substantially dopant-free so that polysilicon capping layer 64 can function as a seal layer or a barrier layer that prevents dopants, such as boron, from outgassing during subsequent processing. For example, polysilicon capping layer 60 covers any dopant-containing portion of silicon-comprising DTI 60, such that silicon-comprising DTI 60 does not have an exposed dopant-containing portion, such as boron-containing portion, like polysilicon DTIs 50A-50C. In some embodiments, a top surface of polysilicon capping layer 64' and the top surface of SOI substrate 10 are substantially planar after the planarization process. In some embodiments, the planarization process includes multiple steps, such as a first planarization that stops at oxide layer 40, a second planarization that stops at patterning layer 22, and/or a third planarization that stops at the top surface of SOI substrate 10. In such embodiments, the first planarization may form polysilicon capping layer 64', while the second planarization and the third planarization may reduce a thickness of poly silicon capping layer 64'.

Silicon-comprising DTI 60 thus has oxide sidewall 40-1, oxide sidewall 40-2, and a bi-layer silicon-comprising layer (i.e., silicon layer 62 and polysilicon capping layer 64') disposed between oxide sidewall 40-1 and oxide sidewall 40-2. Silicon-comprising DTI 60 provides various advantages over polysilicon DTIs, such as polysilicon DTIs 50A-50C. For example, processes used for fabricating silicon-comprising DTI 60 exhibit better gap-fill characteristics, particularly for high aspect ratio isolation trenches, than processes used for fabricating polysilicon DTIs 50A-50C. Silicon-comprising DTI 60 can thus be fabricated with no seams (or voids), which results in an IC device isolated by seam-free silicon-comprising DTI 60 exhibiting lower resistance, and thus improved device reliability, than an IC device isolated by polysilicon DTIs 50A-50C. Even if silicon-comprising DTI 60 has voids therein (which may result from a small seam), such voids are significantly smaller than voids 56A-56I present in polysilicon DTIs 50A-50C and still provide an IC device that exhibits lower resistance and improved device reliability. In another example, silicon-comprising DTI 60 can incorporate dopants, such as boron, to reduce resistance of an IC device but not exhibit outgassing during high temperature thermal processes. In particular, polysilicon capping layer 64' prevents dopant from outgassing during subsequent processing, such as that associated with fabricating an IC device. Preventing dopant outgassing reduces dopant contamination. In some embodiments, polysilicon capping layer 64' prevents outgassing during high temperature annealing processes used to fabricate high voltage IC devices, such as annealing processes that expose a wafer to temperatures greater than about 1,000° C. to drive-in dopants and form n-well and/or p-wells in an SOI substrate. In some embodiments, polysilicon capping layer 64' prevents outgassing during gate formation, such as gate dielectric formation. In yet another example, forming polysilicon layer 64 after forming silicon layer 62 reduces (and, in some embodiments, eliminates) scratching of wafer surfaces of a wafer in which silicon-comprising DTI 60 is incorporated, thereby preventing wafer damage during subsequent processing. In particular, because polysilicon layer 64 covers any particles (e.g., silicon particles) that may form on oxide layer 40 resulting from selectivity loss that occurs during formation of silicon layer 62, polysilicon layer 64 prevents such particles from freely moving during subsequent planarization processes, thereby preventing (or limiting) particles from scratching and/or causing other damage to wafer surfaces during the planarization processes. Different embodiments may have different advantages, and no particular advantage is required of any embodiment.

Silicon layer 62 and polysilicon layer 64 are formed in isolation trench 30 "in-situ." For example, the selective CVD process and the blanket CVD process are performed within the same process chamber, such as a process chamber of a CVD tool, such that a wafer (e.g., SOI substrate 10 and the various layers and/or features fabricated thereon) remain under vacuum conditions. As such, "in-situ" also generally refers to performing various processes on a wafer without exposing the wafer to an external ambient (for example, external to an IC processing system), such as oxygen. Performing the selective CVD and the blanket CVD process can thus minimize (or eliminate) exposure to oxygen and/or other external ambient during processing. In some embodiments, the cleaning process is also performed in-situ with the selective CVD process and the blanket CVD process. In some embodiments, a purging process at various stages of forming silicon layer 62 and polysilicon layer 64, such as before performing the selective CVD process and before the blanket CVD process. The purge process can remove any byproducts from the process chamber. The purge process introduces an inert gas into the process chamber to remove any byproducts from the process chamber, such as a hydrogen-containing gas, a nitrogen-containing gas, an argon-containing gas, a helium-containing gas, other suitable inert gas, or combinations thereof. In some embodiments, processing proceeds from the selective CVD process to the blanket CVD deposition process by adjusting a deposition mixture supplied to a process chamber. For example, an etchant-containing precursor is removed from the deposition mixture to switch from the selective CVD process to the blanket CVD process.

Figure 4A:
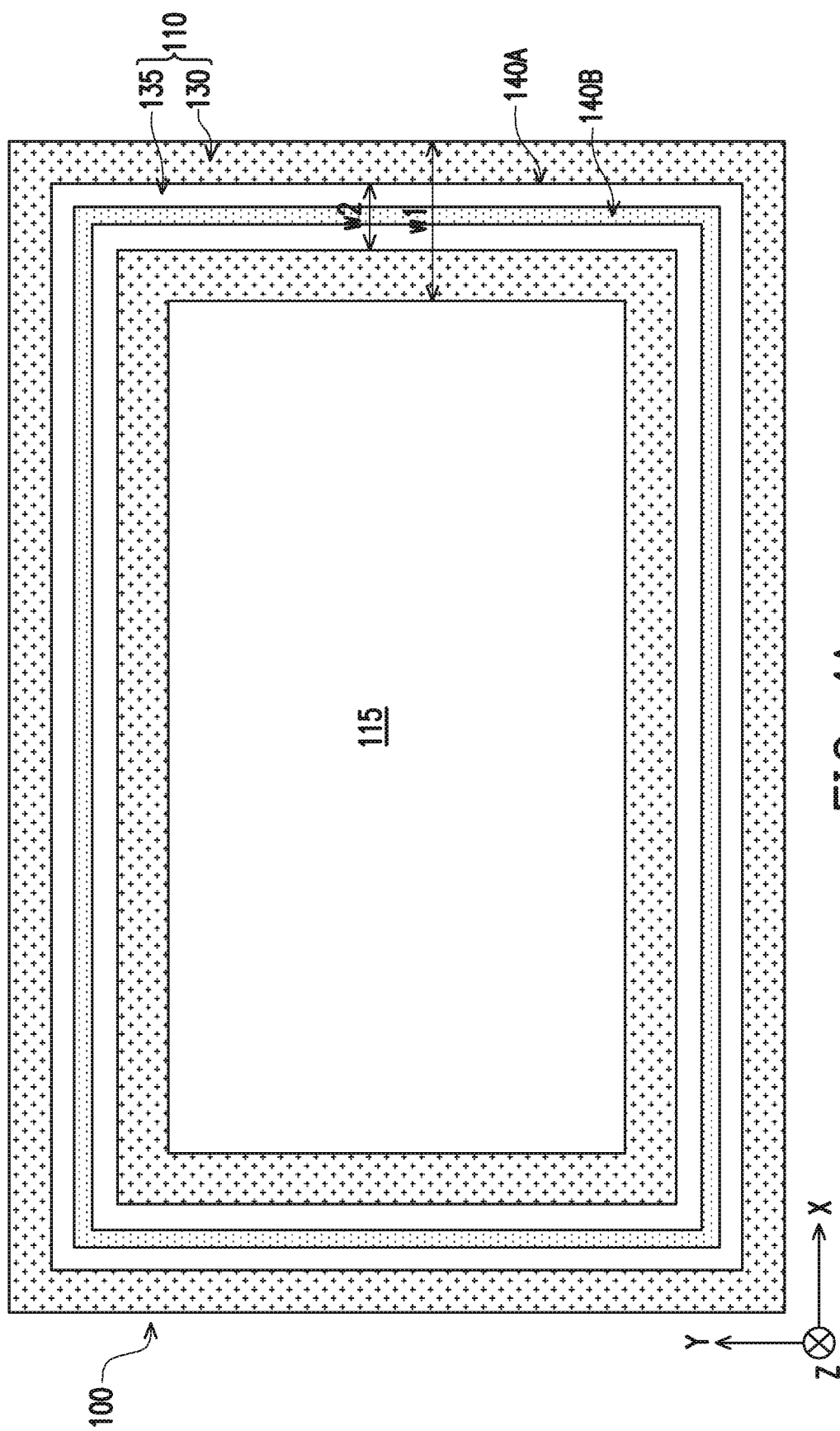
FIG. 4A is a fragmentary top view of an isolation feature of an integrated circuit (IC) device, in portion or entirety, according to various aspects of the present disclosure.
Figure 4B:
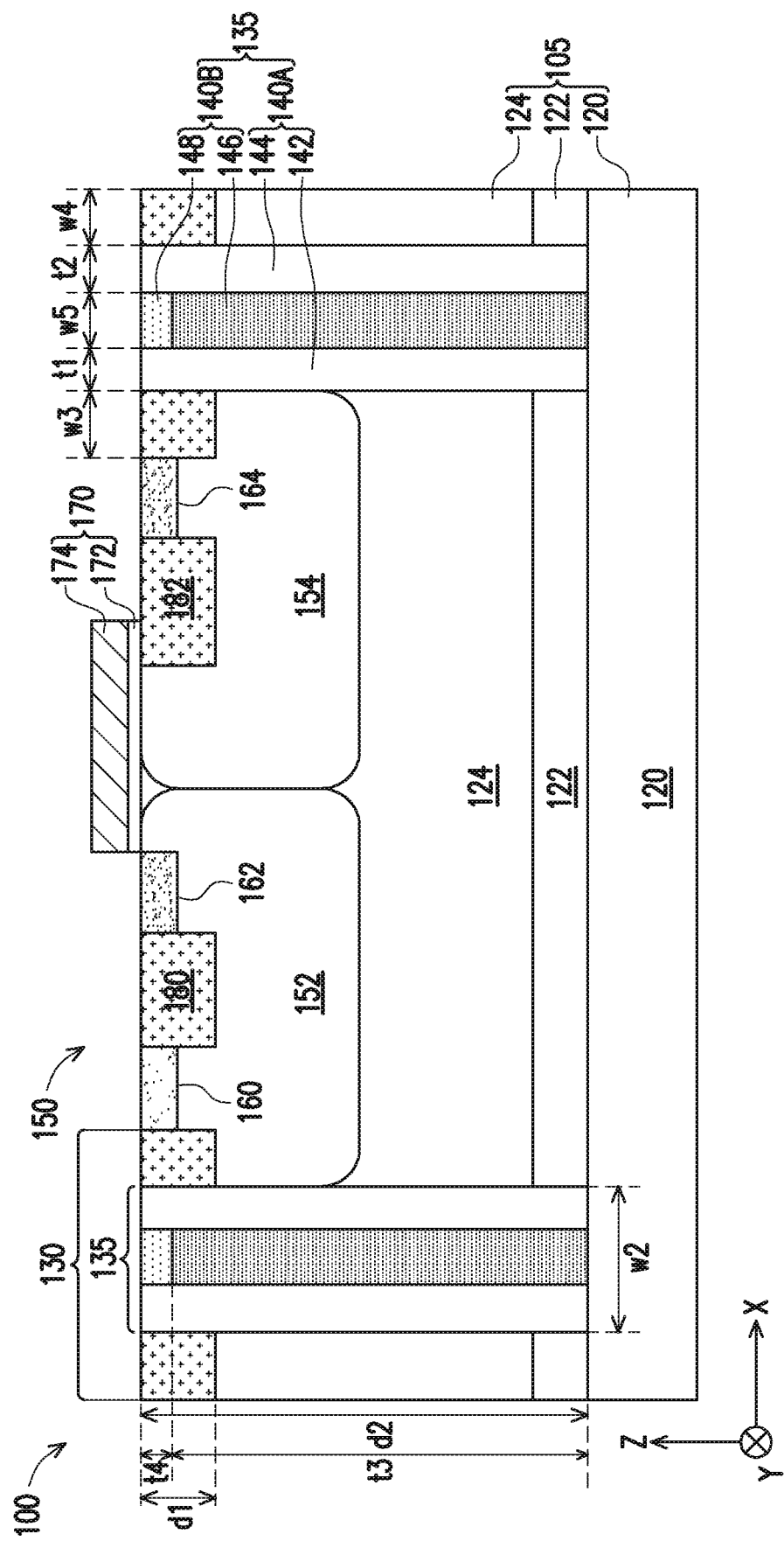
FIG. 4B is a fragmentary cross-sectional view of the isolation feature of the IC device of FIG. 1A, in portion or entirety, according to various aspects of the present disclosure.

FIG. 4A is a fragmentary top view of an IC device 100, in portion or entirety, according to various aspects of the present disclosure. FIG. 4B is a fragmentary cross-sectional view of IC device 100 taken along line B-B of FIG. 4A, in portion or entirety, according to various aspects of the present disclosure. IC device 100 has a semiconductor-on-insulator (SOI) substrate 105 and an isolation feature 110 disposed in SOI substrate 105, where isolation feature 110 surrounds an active region 115 of IC device 100. Active region 115 (also referred to as an OD region) is configured for a transistor and can be referred to as a transistor region. In some embodiments, high voltage devices, such as a high voltage transistor, are fabricated on SOI substrate 105 in active region 115. High voltage devices operate at high voltages, such as transistors that operate at voltages greater than about 100 V. Process for fabricating high voltage devices often include high temperature thermal processes, some of which may expose the high voltage devices to temperatures greater than about 60° C. IC device 100 includes an isolation structure, described below and herein, that can withstand such high temperature thermal processes and improve performance, integrity, and/or reliability of high voltage devices, such as high voltage transistors. In some embodiments, FIG. 4A and FIG. 4B have been simplified for the sake of clarity to better understand the inventive concepts of the present disclosure. Additional features can be added in IC device 100, and some of the features described below can be replaced, modified, or eliminated in other embodiments of IC device 100.

SOI substrate 105 includes a semiconductor layer 120, an insulator layer 122, and a semiconductor layer 124, where insulator layer 122 is disposed between and separates semiconductor layer 120 and semiconductor layer 124. Insulator layer 122 electrically isolates semiconductor layer 120 from semiconductor layer 124. Semiconductor layer 120 and semiconductor layer 124 include a semiconductor material, and insulator layer 122 includes a dielectric material. The semiconductor material can include silicon, germanium, silicon germanium, silicon carbide, gallium arsenide, gallium phosphide, indium phosphide, indium arsenide, indium antimonide, GaAsP, AlInAs, AlGaAs, GaInAs, GaInP, GaInAsP, other suitable semiconductor materials, or combinations thereof. The dielectric material can include silicon, oxygen, nitrogen, carbon, other suitable isolation constituent, or combinations thereof. In the depicted embodiment, semiconductor layer 120 and semiconductor layer 124 include the same semiconductor material, such as silicon, and the insulator layer 122 includes oxygen. In such embodiments, semiconductor layers 120, 124 can be referred to as silicon layers, insulator layer 122 can be referred to as an oxide layer, and SOI substrate 105 can be referred to as a silicon-on-insulator substrate. In some embodiments, semiconductor layer 120 and semiconductor layer 124 include different semiconductor material. In some embodiments, SOI substrate 105 is a silicon germanium-on-insulator (SGOI) substrate. In some embodiments, SOI substrate 105 is a germanium-on-insulator (GOI) substrate. SOI substrate 105 can be fabricated using separation by implantation of oxygen (SIMOX), wafer bonding, and/or other suitable methods. SOI substrate 105 can include various doped regions depending on design requirements of IC device 100. For example, SOI substrate 105 can include p-type doped regions (referred to as a p-well), n-type doped regions (referred to as an n-well), or combinations thereof. N-type doped regions are doped with n-type dopants, such as phosphorus, arsenic, other n-type dopant, or combinations thereof. P-type doped regions are doped with p-type dopants, such as boron, indium, other p-type dopant, or combinations thereof. In some embodiments, SOI substrate 105 includes doped regions formed with a combination of p-type dopants and n-type dopants.

Isolation feature 110 surrounds and electrically isolates active region 115 from other active regions and/or passive regions of IC device 100. In FIG. 4B, isolation feature 110 is disposed in SOI substrate 105 and surrounds active region 115, such that isolation feature 110 can be referred to as an isolation ring. Isolation feature 110 can have any suitable configuration and can include different structures, such as shallow trench isolation (STI) structures, deep trench isolation (DTI) structures, local oxidation of silicon (LOCOS) structures, other suitable isolation structures, or combinations thereof. In some embodiments, STI structures generally have a depth that is less than a thickness of semiconductor layer 124, while DTI structures generally have a depth that is equal to or greater than semiconductor layer 124, such that DTI structures extend at least to insulator layer 122. In some embodiments, STI structures have a depth that is less than about 0.5 μm, while DTI structures have a depth that is greater than about 5 μm. In the depicted embodiment, isolation feature 110 includes an STI structure 130 and a DTI structure 135, each of which surrounds active region 115 and can be referred to as an STI ring and a DTI ring, respectively. STI structure 130 has a width w1 and a depth d1. DTI structure 135 has a width w2 and a depth d2, where width w2 is less than width w1 and depth d2 is greater than depth d1. In some embodiments, width w1 is about 0.3 μm to about 3 μm. In some embodiments, width w2 is about 0.1 μm to about 1 μm. In some embodiments, depth d1 is about 0.5 μm to about 3 μm. In some embodiments, depth d2 is about 1 μm to about 50 μm. In FIG. 4B, width w1 and width w2 are defined along the x-direction between sidewalls of STI structure 130 and DTI structure 135, respectively, and depth d1 and depth d2 are defined along the z-direction between a top surface of semiconductor layer 124 and a bottom of STI structure 130 and DTI structure 135, respectively. DTI structure 135 extends through STI structure 130, such that DTI structure 135 is disposed between a first portion of STI structure 130 having a width w3 and a second portion of STI structure 130 having a width w4. In some embodiments, width w3 is about 0.1 μm to about 1 μm, and width w4 is about 0.1 μm to about 1 μm. In the depicted embodiment, a center of DTI structure 135 is aligned with a center of STI structure 130, such that width w3 is about equal to width w4. In some embodiments, the center of DTI structure 135 is not aligned with the center of STI structure 130, such that width w3 is different than width w4. In some embodiments, a sidewall of DTI structure 135 is aligned with a sidewall of STI structure 130, such that STI structure 130 is not divided into a first portion and a second portion as depicted. In such embodiments, STI structure 130 is disposed between and separates active region 115 and DTI structure 135 or DTI structure 135 is disposed between and separates active region 115 and STI structure 130 depending on sidewall alignment.

STI structure 130 includes silicon oxide, silicon nitride, silicon oxynitride, other suitable isolation material (for example, including silicon, oxygen, nitrogen, carbon, or other suitable isolation constituent), or combinations thereof. STI structure 130 can be formed by forming a patterned mask layer over SOI substrate 105, where the patterned mask layer 105 has an opening therein that exposes semiconductor layer 124 of SOI substrate 105; etching a trench in semiconductor layer 124 using the patterned mask layer as an etch mask (for example, by using a dry etching process and/or a wet etching process); and depositing an insulator material that fills the trench (for example, by a chemical vapor deposition (CVD) process or a spin-on glass process). A chemical mechanical polishing (CMP) process may be performed to remove excess insulator material, such as insulator material disposed over the top surface of semiconductor layer 124, and/or planarize a top surface of STI structure 130 and/or the top surface of semiconductor layer 124. In another example, where SOI substrate 105 is patterned to have various fins (e.g., active region 115 being one of the fins formed from semiconductor layer 124), STI structure 130 can be formed by depositing an insulator material after forming the fins and etching back the insulator material to form STI structure 130. In such embodiments, the insulator material can fill gaps (trenches)

between the fins. In some embodiments, STI structure 130 includes a multi-layer structure that fills the trenches, such as a silicon oxide layer disposed over a silicon nitride liner and/or an oxide liner. In another example, STI structure 130 includes a dielectric layer disposed over a doped liner layer (including, for example, boron silicate glass (BSG) or phosphosilicate glass (PSG)). In yet another example, STI structure 130 includes a bulk dielectric layer disposed over a dielectric liner. In some embodiments, STI structure 130 is formed by a flowable CVD (FCVD) process that includes, for example, depositing a flowable material (such as a liquid compound) over SOI substrate 105 and converting the flowable material into a solid material by a suitable technique, such as thermal annealing and/or ultraviolet radiation treatment. In some embodiments, STI structure 130 is formed by a high-density plasma (HDP) process and/or a high aspect ratio deposition (HARP) process.

DTI structure 135 extends through SOI substrate 105 to at least insulator layer 122. In some embodiments, DTI structure 135 is a high aspect ratio isolation structure, which generally refers to an isolation structure having a ratio of a depth to a width (D/W) that is greater than about 5. For example, a ratio of depth d2 to width w2 (d2/w2) is about 5 to about 50. In FIG. 4B, DTI structure 135 extends completely through semiconductor layer 124 and insulator layer 122 to semiconductor layer 120 (in particular, to a top surface of semiconductor layer 122). Depth d2 is thus equal to a sum of a thickness of semiconductor layer 124 and a thickness of insulator layer 122. In some embodiments, depth d2 is greater than the sum of the thickness of semiconductor layer 124 and the thickness of insulator layer 122, such that DTI structure 135 extends completely through semiconductor layer 124 and insulator layer 122 and partially through semiconductor layer 120. In some embodiments, depth d2 is equal to a sum of the thickness of semiconductor layer 124, the thickness of insulator layer 122, and a thickness of semiconductor layer 120, such that DTI structure 135 extends completely through SOI substrate 105 (i.e., completely through semiconductor layer 124, insulator layer 122, and semiconductor layer 120). In some embodiments, depth d2 is less than a thickness of semiconductor layer 124, such that DTI structure extends partially through semiconductor layer 124. In some embodiments, depth d2 is equal to a thickness of semiconductor layer 124, such that DTI structure 135 extends completely through semiconductor layer 124 to a top surface of insulator layer 122. In some embodiments, depth d2 is greater than the thickness of semiconductor layer 124 and less than the sum of the thickness of semiconductor layer 124 and the thickness of insulator layer 122, such that DTI structure 135 extends completely through semiconductor layer 124 and partially through insulator layer 122.

Figure 9:
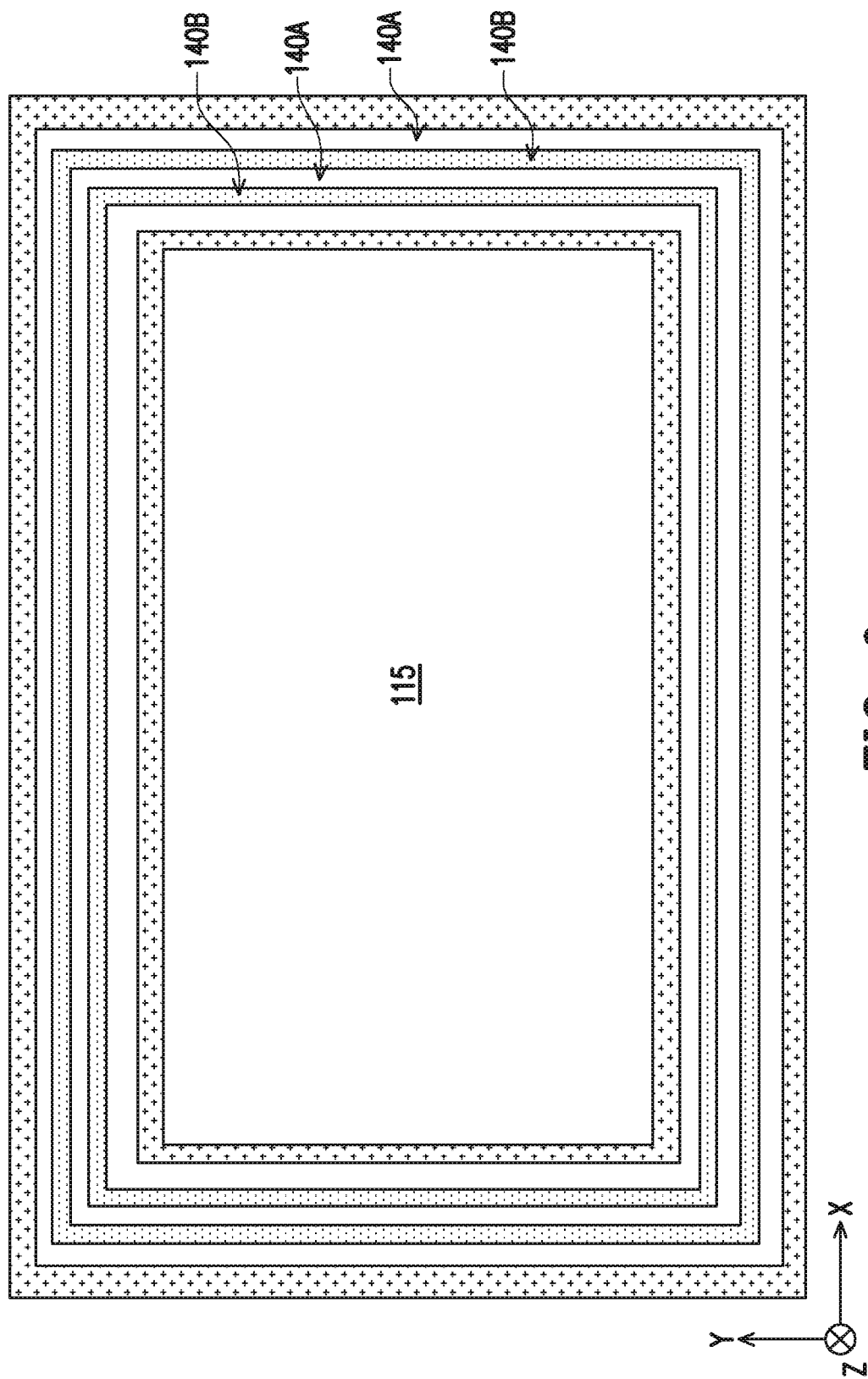
FIG. 9 is a fragmentary top view of another isolation feature of an IC device, in portion or entirety, according to various aspects of the present disclosure.

DTI structure 135 includes an oxide DTI portion 140A and a multilayer silicon-comprising DTI portion 140B, each of which surrounds active region 115. In some embodiments, oxide DTI portion 140A is referred to as an oxide ring and multilayer silicon-comprising DTI portion 140B is referred to as a multilayer silicon-comprising ring. In FIG. 4A and FIG. 4B, active region 115 is surrounded by a single ring isolation structure, a single ring STI structure, and a single ring DTI structure. In some embodiments, active region 115 is surrounded by a multi-ring DTI structure, such as depicted in FIG. 9, which includes two multilayer silicon-comprising rings surrounding active region 115. Oxide DTI portion 140A lines sidewalls of DTI structure 135 and can thus be referred to as an oxide liner. In FIG. 4B, oxide DTI portion 140A includes an oxide layer 142 and an oxide layer 144. Oxide layer 142 is disposed between and separates a first sidewall of multilayer silicon-comprising DTI portion 140B and SOI substrate 105 (for example, semiconductor layer 124 and insulator layer 122), and oxide layer 144 is disposed between and separates a second sidewall of multilayer silicon-comprising DTI portion 140B and SOI substrate 105. Oxide layer 142 and oxide layer 144 are also respectively disposed between the first sidewall and the second sidewall of multilayer silicon-comprising DTI portion 140B and STI structure 130. In some embodiments, oxide layer 142 and oxide layer 144 represent portions of a single, continuous oxide layer that wraps/surrounds multilayer silicon-comprising DTI portion 140B. Oxide layer 142 has a thickness t1 and oxide layer 144 has a thickness t2. Thickness t1 and thickness t2 are defined along the x-direction between a respective sidewall of DTI structure 135 and a respective sidewall of multilayer silicon-comprising DTI portion 140B. In the depicted embodiment, thickness t1 is about equal to thickness t2. In some embodiments, thickness t1 is different than thickness t2 depending on alignment of DTI structure 135 and STI structure 130. Oxide layer 142 has a length defined along the z-direction and oxide layer 144 has a length along the z-direction, where the length of oxide layer 142 and the length of oxide layer 144 are equal to about depth d2. Thickness t1 and thickness t2 are defined along the x-direction between a respective sidewall of DTI structure 135 and a respective sidewall of multilayer silicon-comprising DTI portion 140B. Oxide layers 142, 144 include a dielectric material having oxygen in combination with another chemical element, such as silicon, nitrogen, carbon, other suitable electrical isolation constituent, or combinations thereof. For example, oxide layers 142, 144 each include oxygen and silicon and can be referred to as silicon oxide liners.

Multilayer silicon-comprising DTI portion 140B includes two layers—a silicon layer 146 and a polysilicon capping layer 148—and can be referred to as a bi-layer silicon-comprising DTI structure. Silicon layer 146 and polysilicon capping layer 148 each extend continuous and uninterrupted along the x-direction from oxide layer 142 to oxide layer 144 to form a bottom portion and a top portion, respectively, of multilayer silicon-comprising DTI portion 140B. Silicon layer 146 and polysilicon capping layer 148 are similar to silicon layer 62 and polysilicon layer 64, respectively, described above. For example, silicon layer 146 includes monocrystalline silicon and polysilicon capping layer 148 includes polycrystalline silicon. In the depicted embodiment, silicon layer 146 includes intrinsic, undoped crystalline silicon (i.e., silicon layer 146 is substantially free of dopants) or silicon layer 146 includes crystalline silicon doped with p-type dopants, n-type dopants, or combinations thereof. In some embodiments, silicon layer 146 is a boron-doped silicon layer having a boron dopant concentration of about $1 \times 10^{14}$ cm$^{-3}$ to about $1 \times 10^{20}$ cm$^{-3}$. In the depicted embodiment, polysilicon capping layer 148 is undoped or unintentionally doped. In other words, polysilicon capping layer 148 is substantially free of dopants, and in particular, substantially free of boron dopants. Silicon layer 146 has a thickness t3 defined along the z-direction, and polysilicon capping layer 148 has a thickness t4 defined along the z-direction. Thickness t4 is less than thickness t3 and less than depth d1. In some embodiments, thickness t3 is about 6 μm to about 8 μm. In some embodiments, thickness t4 is less than about 2 μm. For example, thickness t4 is about 0.5 μm to about 1 μm. In FIG. 4B, multilayer silicon-comprising DTI portion 140B has a width w5 that is substantially uniform along depth d2. In some embodiments, width w5 is about 0.1 µm to about 1 µm. In such embodiments, silicon layer 146 and polysilicon capping layer 148 each have substantially uniform widths (e.g., width w5) along thickness t3 and thickness t4, respectively.

A transistor 150 is fabricated in active region 115. In the depicted embodiment, transistor 150 is a high voltage transistor that operates at high voltages. Transistor 150 includes a p-well 152 and an n-well 154 disposed in semiconductor layer 124 of SOI substrate 105, various doped regions disposed in p-well 152 (e.g., a p-doped region 160 and an n-doped region 162), various doped regions disposed in n-well 154 (e.g., n-doped region 164), and a gate 170 (including, for example, a gate dielectric 172 and a gate electrode 174). Additional isolation structures may be disposed in active region 115 to separate and isolate device features, such as an STI structure 180 disposed in p-well 152 and an STI structure 182 disposed in n-well 154. STI isolation structure 130 extends into and is partially disposed in p-well 152 and n-well 154, where p-doped region 160 is disposed between STI structure 130 and STI structure 180, n-doped region 164 is disposed between STI structure 130 and STI structure 182, and STI structure 180 is disposed between p-doped region 160 and n-doped region 162. In some embodiments, gate 170 is disposed between a source region and a drain region of transistor 150, where a channel region is formed in semiconductor layer 124 of SOI substrate 110 between the source region and the drain region. Gate 170 engages the channel region, such that current can flow between the source region and the drain region (collectively referred to as source/drain regions) during operation. In some embodiments, gate 170 further includes gate spacers disposed along sidewalls of gate dielectric 172 and gate electrode 174. In some embodiments, contacts are disposed on p-doped region 160, n-doped region 162, and/or n-doped region 164.

Figure 5:
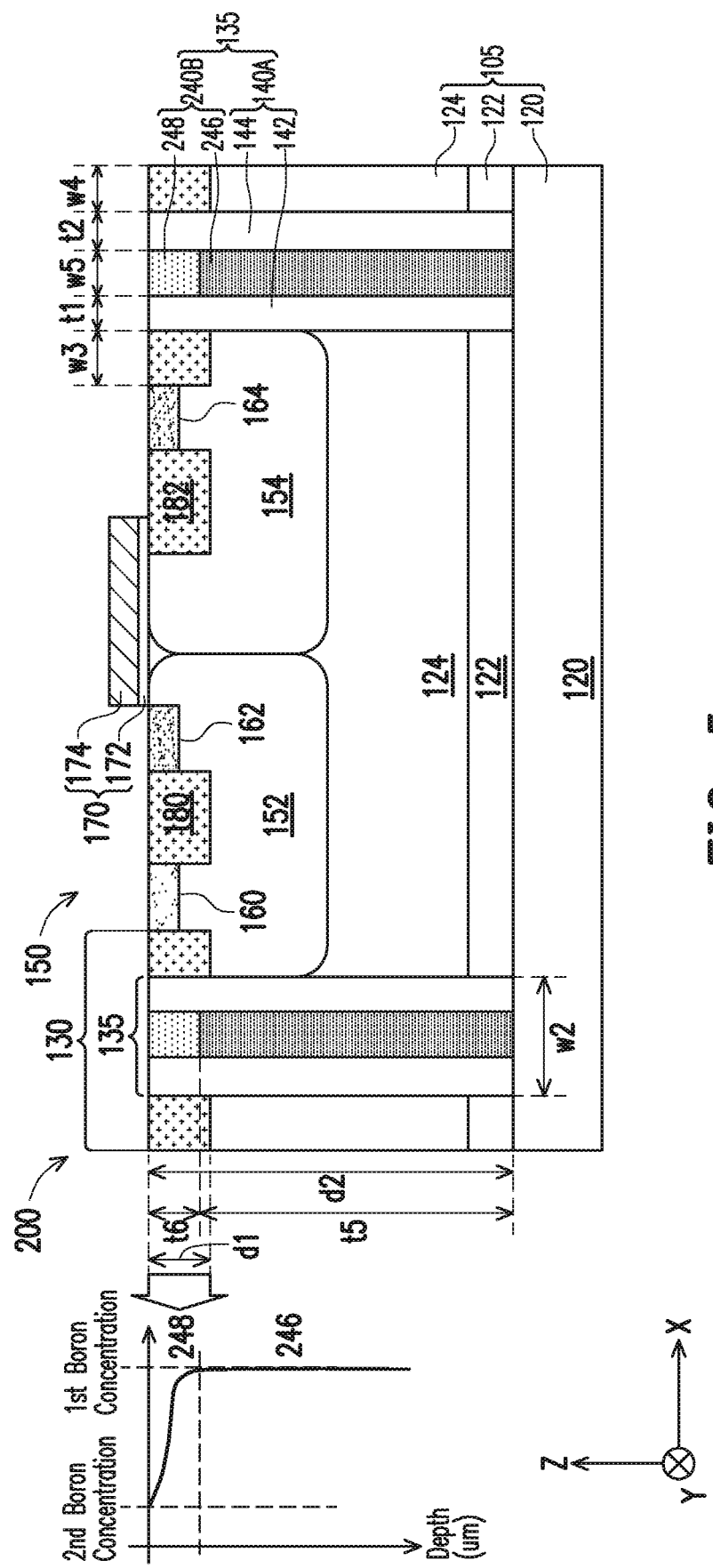
FIG. 5 is a diagrammatic cross-sectional view of another isolation feature of an IC device, in portion or entirety, according to various aspects of the present disclosure.

FIG. 5 is a diagrammatic cross-sectional view of an IC device 200, in portion or entirety, according to various aspects of the present disclosure. For clarity and simplicity, similar features of IC device 100 in FIG. 4A and FIG. 4B and IC device 200 in FIG. 5 are identified by the same reference numerals. For example, IC device 200 includes isolation feature 110 disposed in and surrounding active region 115 of SOI substrate 105, where isolation feature 110 includes STI structure 130 and DTI structure 135. In contrast to IC device 100, DTI structure 135 has oxide DTI portion 140A and a multilayer silicon-comprising DTI portion 240B. Multilayer polysilicon DTI portion 240B has a bi-layer DTI structure similar to multilayer silicon-comprising portion 140B, such as a silicon layer 246 and a polysilicon capping layer 248 disposed over silicon layer 246. Silicon layer 246 is similar to silicon layer 146 described above, and in the depicted embodiment, is a boron-doped silicon layer. Polysilicon capping layer 248 is similar to polysilicon capping layer 148 described above, except polysilicon capping layer 248 has a gradient boron dopant concentration that decreases from a first boron concentration at an interface between silicon layer 246 and polysilicon capping layer 248 to a second boron concentration at top surface of polysilicon capping layer 248. In some embodiments, the second boron concentration is zero (or substantially zero). In some embodiments, the second boron concentration is less than or equal to about $1 \times 10^{17}$ cm$^{-3}$, which is sufficiently low enough to consider a top surface (or topmost region of polysilicon layer 248) as undoped and avoid outgassing of boron during subsequent processing. In some embodiments, the first dopant concentration is about $6 \times 10^{18}$ cm$^{-3}$. In FIG. 5, silicon layer 246 has a thickness t5 that is less than thickness t3 and polysilicon capping layer 248 has a thickness t6 that is greater than thickness t4. In some embodiments, thickness t5 is about 4 µm to about 7 µm, and thickness t6 is about 1 µm to about 6 µm. In some embodiments, silicon layer 246 and polysilicon capping layer 248 have thickness t3 and thickness t4. In some embodiments, such as depicted, silicon layer 246 has a substantially uniform boron concentration along its thickness t6, such as the first dopant concentration along its thickness t6. FIG. 5 has been simplified for the sake of clarity to better understand the inventive concepts of the present disclosure. Additional features can be added in IC device 200, and some of the features described below can be replaced, modified, or eliminated in other embodiments of IC device 200.

Figure 6:
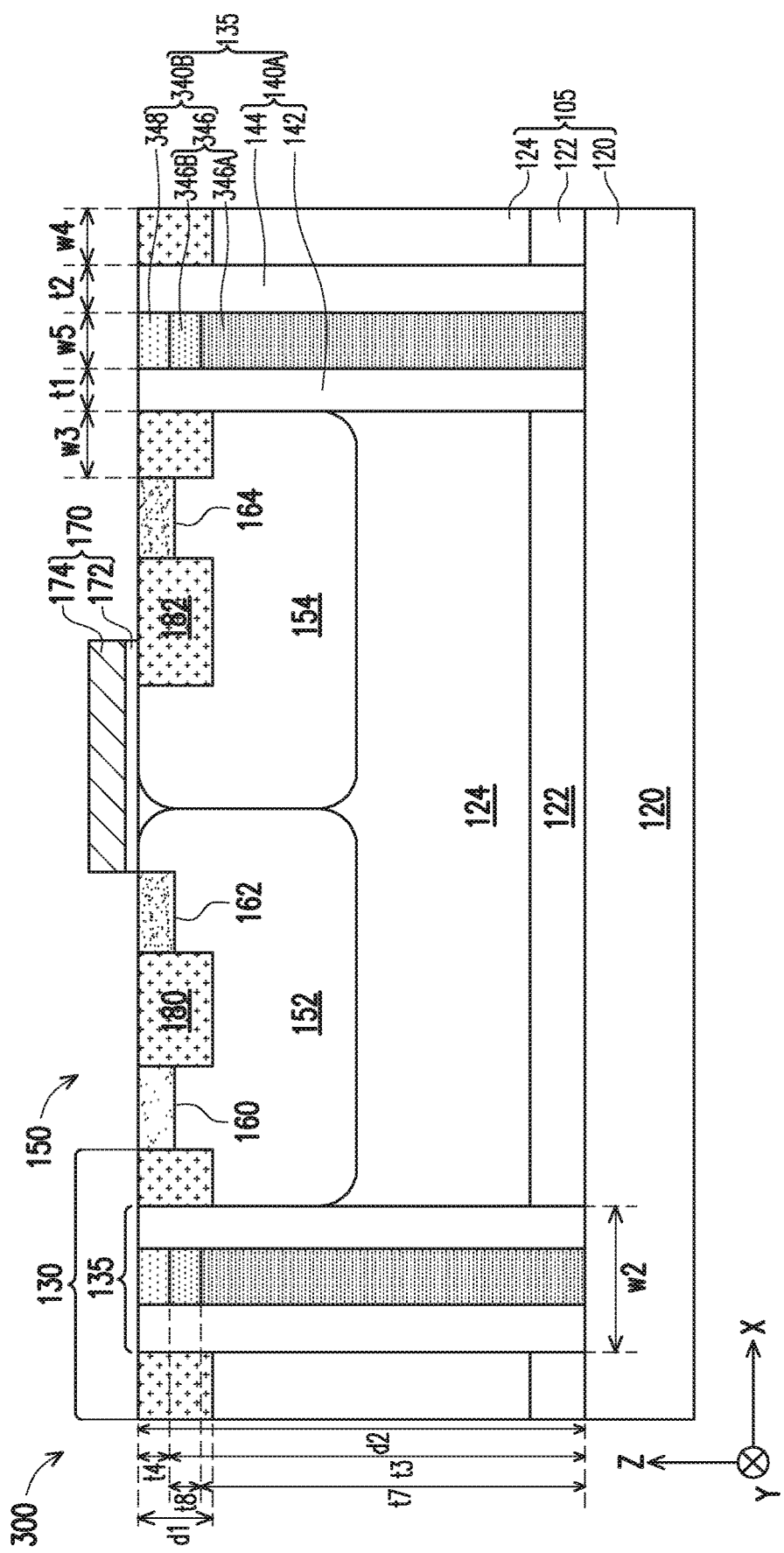
FIG. 6 is a diagrammatic cross-sectional view of another isolation feature of an IC device, in portion or entirety, according to various aspects of the present disclosure.

FIG. 6 is a diagrammatic cross-sectional view of an IC device 200, in portion or entirety, according to various aspects of the present disclosure. For clarity and simplicity, similar features of IC device 100 in FIG. 4A and FIG. 4B and IC device 300 in FIG. 6 are identified by the same reference numerals. For example, IC device 300 includes isolation feature 110 disposed in and surrounding active region 115 of SOI substrate 105, where isolation feature 110 includes STI structure 130 and DTI structure 135. In contrast to IC device 100, DTI structure 135 has oxide DTI portion 140A and a multilayer silicon-comprising DTI portion 340B. Multilayer silicon-comprising DTI portion 340B has a tri-layer DTI structure, instead of a bi-layer structure like DTI portion 140B like multilayer silicon-comprising portion 140B. For example, multilayer silicon-comprising DTI portion 340B has a bi-layer silicon layer 346 and a polysilicon capping layer 348. Bi-layer silicon layer 346 includes a silicon layer 346A having a first boron concentration and a silicon layer 346B having a second boron concentration, where silicon layer 346B is disposed between silicon layer 346A and polysilicon capping layer 348 and the first boron concentration is greater than the second boron concentration. In some embodiments, silicon layer 346A and silicon layer 346B can be referred to as a heavily doped silicon layer and a lightly doped silicon layer, respectively. Polysilicon capping layer 348 is similar to polysilicon capping layer 148 described above. In the depicted embodiment, polysilicon capping layer 348 is an undoped polysilicon layer. Silicon layer 346A has a thickness t7, silicon layer 346B has a thickness t8, and a sum of thickness t7 and thickness t8 is equal to thickness t3. In some embodiments, thickness t7 is about 4 µm to about 7 µm. In some embodiments, thickness t8 is about 0.2 µm to about 2 µm. FIG. 3 has been simplified for the sake of clarity to better understand the inventive concepts of the present disclosure. Additional features can be added in IC device 300, and some of the features described below can be replaced, modified, or eliminated in other embodiments of IC device 300.

Figure 7:
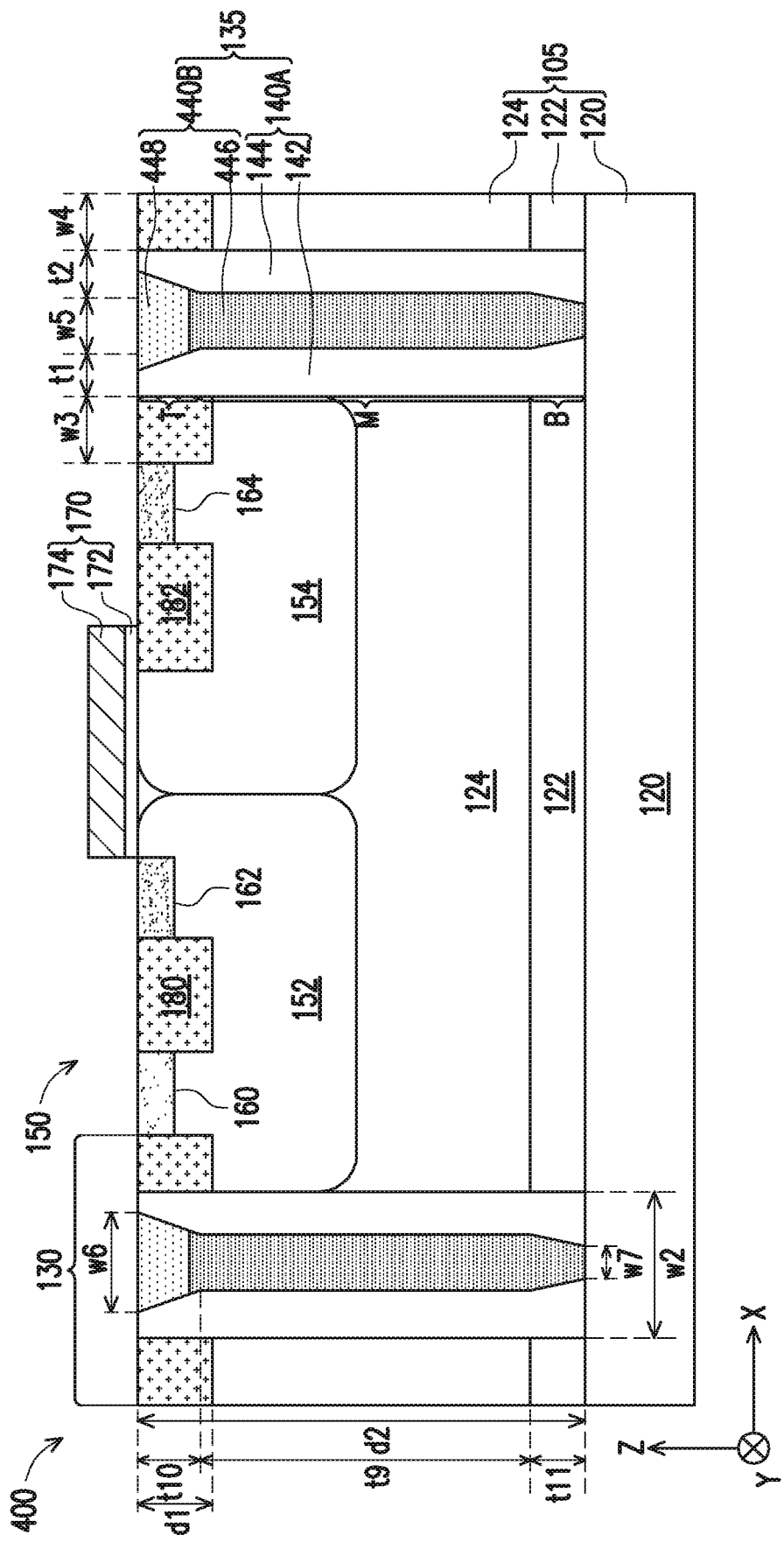
FIG. 7 is a diagrammatic cross-sectional view of another isolation feature of an IC device, in portion or entirety, according to various aspects of the present disclosure.

FIG. 7 is a diagrammatic cross-sectional view of an IC device 400, in portion or entirety, according to various aspects of the present disclosure. For clarity and simplicity, similar features of IC device 100 in FIG. 4A and FIG. 4B and IC device 400 in FIG. 7 are identified by the same reference numerals. For example, IC device 400 includes isolation feature 110 is disposed in and surrounding active region 115 of SOI substrate 105. Isolation feature 110 is adjacent to and contacts active region 115. Isolation feature 110 includes STI structure 130 and DTI structure 135. In contrast to IC device 100, DTI structure 135 has oxide DTI portion 140A and a multilayer silicon-comprising DTI portion 440B. Multilayer silicon-comprising DTI portion 440B has a bi-layer DTI structure similar to multilayer silicon-comprising portion 140B, except a profile of multilayer silicon-comprising DTI portion 440B is different than a profile of multilayer silicon-comprising portion 140B. For example, multilayer silicon-comprising DTI portion 440B includes a silicon layer 446 and a polysilicon capping layer 448 that are similar to silicon layer 146 and polysilicon capping layer 148 (e.g., undoped) or polysilicon capping layer 248 (e.g., gradient dopant concentration), respectively, as described above, but a width of multilayer silicon-comprising portion DTI portion 240B varies along depth d2 of DTI structure 135 instead of being substantially uniform along depth d2 like multilayer silicon-comprising DTI portion 140B. For example, multilayer silicon-comprising DTI portion 440B is divided into a top end T, a bottom end B, and a middle M disposed between top end T and bottom end B. Middle has a thickness 9 and a substantially uniform width along its thickness t9, such as width w5. Top end T has a thickness t10, where a width of top end T decreases from a width w6 to width w5 along thickness t10. Bottom end B has a thickness t11, where a width of bottom end B decreases from width w5 to a width w7 along thickness t11. Multilayer silicon-comprising DTI portion 440B thus has a wider top end (portion) and a narrower bottom end (portion). In FIG. 7, polysilicon capping layer 448 and a portion of silicon layer 446 form top end T. In such embodiments, silicon layer 446 has a middle disposed between tapered ends. In some embodiments, only polysilicon capping layer 448 forms top end T. FIG. 7 has been simplified for the sake of clarity to better understand the inventive concepts of the present disclosure. Additional features can be added in IC device 400, and some of the features described below can be replaced, modified, or eliminated in other embodiments of IC device 400.

Figure 8:
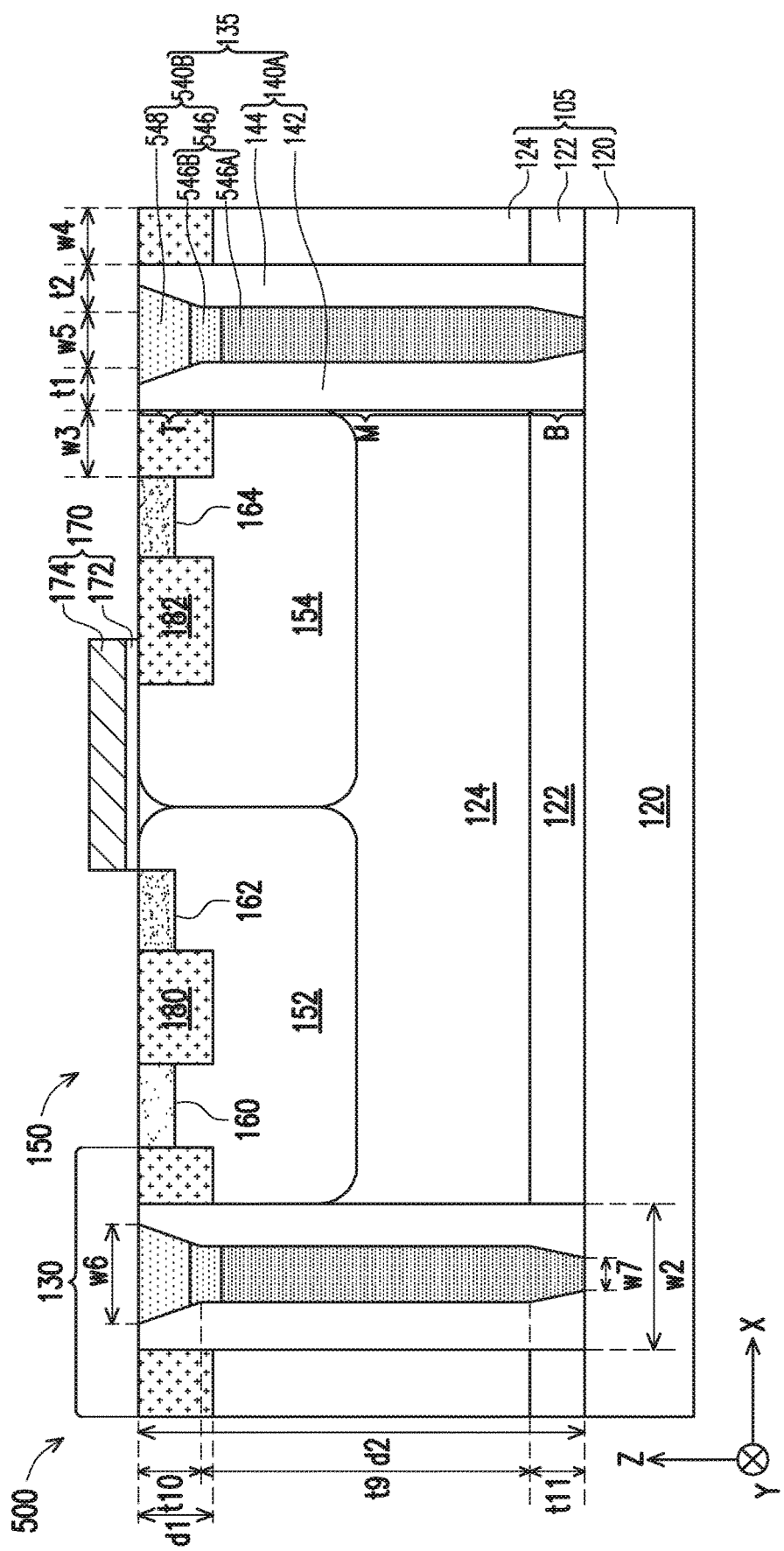
FIG. 8 is a diagrammatic cross-sectional view of another isolation feature of an IC device, in portion or entirety, according to various aspects of the present disclosure.

FIG. 8 is a diagrammatic cross-sectional view of an IC device 500, in portion or entirety, according to various aspects of the present disclosure. For clarity and simplicity, similar features of IC device 100 in FIG. 4A and FIG. 4B and IC device 800 in FIG. 8 are identified by the same reference numerals. For example, IC device 500 includes isolation feature 110 disposed in and surrounding active region 115 of SOI substrate 105, where isolation feature 110 includes STI structure 130 and DTI structure 135. In contrast to IC device 100, DTI structure 135 has oxide DTI portion 140A and a multilayer silicon-comprising DTI portion 540B. Multilayer silicon-comprising DTI portion 540B has a tri-layer DTI structure similar to multilayer silicon-comprising portion 340B of IC device 300, except a profile of multilayer silicon-comprising DTI portion 540B is different than a profile of multilayer silicon-comprising portion 340B. For example, multilayer silicon-comprising DTI portion 540B has a bi-layer silicon layer 546 (for example, a silicon layer 546A and a silicon layer 546B) and a polysilicon capping layer 548. Silicon layer 546A, silicon layer 546B, and polysilicon capping layer 548 are similar to silicon layer 346A, silicon layer 346B, and polysilicon capping layer 348, respectively, as described above, but a width of multilayer silicon-comprising portion DTI portion 540B varies along depth d2 of DTI structure 135 instead of being substantially uniform along depth d2 like multilayer silicon-comprising DTI portion 340B. For example, in FIG. 8, multilayer silicon-comprising DTI portion 540B is divided into a top end T, a bottom end B, and a middle M disposed between top end T and bottom end B, which are similar to top end T, bottom end B, and middle M of multilayer silicon-comprising DTI 440B described above. Multilayer silicon-comprising DTI portion 540B thus has a wider top end (portion) and a narrower bottom end (portion). In the depicted embodiment, polysilicon capping layer 548 and a first portion of silicon layer 546B form top end T, a second portion of silicon layer 546B and a first portion of silicon layer 546A form middle, and a second portion of silicon layer 546A forms bottom end B. In such embodiments, silicon layer 546B and silicon layer 5456B each have a tapered width portion and a substantially uniform width portion. In some embodiments, only polysilicon capping layer 548 forms top end T. In some embodiments, polysilicon capping layer 548, silicon layer 546A, and silicon layer 546B form top end T. FIG. 8 has been simplified for the sake of clarity to better understand the inventive concepts of the present disclosure. Additional features can be added in IC device 500, and some of the features described below can be replaced, modified, or eliminated in other embodiments of IC device 500.

IC device 100, IC device 200, IC device 300, IC device 400, IC device 500, and/or IC device 600 may be included in a microprocessor, a memory, and/or other IC device. In some embodiments, IC device 100, IC device 200, IC device 300, IC device 400, IC device 500, and/or IC device 600 may be a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof.

The present disclosure provides for many different embodiments. Deep trench isolation structures for high voltage semiconductor-on-insulator devices are disclosed herein. An exemplary deep trench isolation structure surrounds an active region of a semiconductor-on-insulator substrate. The deep trench isolation structure includes a first insulator sidewall spacer, a second insulator sidewall spacer, and a multilayer silicon-comprising isolation structure disposed between the first insulator sidewall spacer and the second insulator sidewall spacer. The multilayer silicon-comprising isolation structure includes a top polysilicon portion disposed over a bottom silicon portion. The bottom polysilicon portion is formed by a selective deposition process, while the top polysilicon portion is formed by a non-selective deposition process.

In some embodiments, the semiconductor-on-insulator substrate includes a first semiconductor layer, a second semiconductor layer disposed over the first semiconductor layer, and an insulator layer disposed between the first semiconductor layer and the second semiconductor layer. In such embodiments, the isolation structure extends through the second semiconductor layer and the insulator layer of the semiconductor-on-insulator substrate to the first semiconductor layer of the semiconductor-on-insulator substrate. In some embodiments, the top polysilicon portion has a first thickness, the bottom silicon portion has a second thickness, a sum of the first thickness and the second thickness is equal to a depth of the isolation structure in the semiconductor-on-insulator substrate, and the second thickness is greater than the first thickness. In some embodiments, the bottom silicon portion includes dopants, such as boron, and the top polysilicon portion is free of dopants. In some embodiments, the bottom silicon portion includes a first silicon layer and a second silicon layer, the first silicon layer has a first dopant concentration, the second silicon layer has a second dopant concentration, the first silicon layer is disposed between the top polysilicon portion and the second silicon layer, and the first dopant concentration is less than the second dopant concentration. In some embodiments, the top polysilicon portion has a gradient dopant concentration that decreases from a first dopant concentration at an interface of the top polysilicon portion and the bottom silicon portion to a second dopant concentration at a top surface of the top polysilicon portion. In such embodiments, a topmost surface of the top polysilicon portion may be substantially dopant free. In some embodiments, the top polysilicon portion has a tapered width. In some embodiments, the bottom silicon portion has a first portion having a first tapered width, a second portion having a substantially uniform width, and a third portion having a second tapered width, wherein the second portion is disposed between the first portion and the second portion.

An exemplary device includes a silicon-on-insulator substrate having a first silicon layer, an insulator layer disposed over the first silicon layer, and a second silicon layer disposed over the insulator layer. The device further includes a first isolation structure and a second isolation structure disposed in the silicon-on-insulator substrate. The first isolation structure extends to a first depth in the silicon-on-insulator substrate, and the second isolation structure extends through the first isolation structure to a second depth in the silicon-on-insulator substrate that is greater than the first depth. The second isolation structure includes a polysilicon capping layer disposed over a silicon layer. A sum of a first thickness of the polysilicon capping layer and a second thickness of the silicon layer is equal to the second depth of the second isolation structure. In some embodiments, the second isolation structure further includes an oxide layer that separates first sidewalls of the polysilicon capping layer from the first isolation structure and further separates second sidewalls of the silicon layer from the first isolation structure and the silicon-on-insulator substrate. In some embodiments, a length of the oxide layer is equal to the second depth of the second isolation structure.

In some embodiments, the first thickness of the polysilicon capping layer is less than the first depth of the first isolation structure. In some embodiments, the first isolation structure and the second isolation structure form an isolation ring that surrounds an active region of the silicon-on-insulator substrate. A device may be disposed in the active region. In some embodiments, the second isolation structure physically contacts the second silicon layer of the silicon-on-insulator substrate. In some embodiments, a top end of the second isolation structure is wider than a bottom end of the second isolation structure. In some embodiments, the silicon layer is a boron-doped silicon layer and the polysilicon capping layer is free of boron.

An exemplary method includes receiving a semiconductor-on-insulator substrate that includes a first semiconductor layer, an insulator layer disposed over the first semiconductor layer, and a second semiconductor layer disposed over the insulator layer. The method further includes forming an isolation trench in the semiconductor-on-insulator substrate. The isolation trench extends through the second semiconductor layer and the insulator layer to expose the second semiconductor layer of the semiconductor-on-insulator substrate. The method further includes performing a selective deposition process to form a silicon layer that fills a bottom portion of the isolation trench and performing a non-selective deposition process to form a polysilicon layer that fills a top portion of the isolation trench. In some embodiments, the selective deposition process and the non-selective deposition process are formed in-situ. In some embodiments, performing the selective deposition process includes using a silicon-containing precursor and an etchant-containing precursor and performing the non-selective deposition process includes using the silicon-containing precursor but not the etchant-containing precursor. In some embodiments, the insulator layer is a first insulator layer and the method can further include forming a second insulator layer along sidewalls of the isolation trench before performing the selective deposition process. In such embodiments, the silicon layer fills a remainder of the bottom portion of the isolation trench and the polysilicon layer fills a remainder of the top portion of the isolation trench.

Another exemplary device includes a silicon-on-insulator substrate that includes a first silicon layer, a second silicon layer disposed over the first silicon layer, and a first insulator layer disposed between the first silicon layer and the second silicon layer. The device further includes a multilayer polysilicon-comprising isolation structure that surrounds and isolates an active device region. The multilayer polysilicon-comprising isolation structure extends through the second silicon layer and the first insulator layer of the silicon-on-insulator substrate to the first silicon layer of the silicon-on-insulator substrate. The multilayer polysilicon-comprising isolation structure includes a top polysilicon-comprising portion disposed over a bottom polysilicon-comprising portion. The top polysilicon-comprising portion is different than the bottom polysilicon-comprising portion. The device further includes a second insulator layer disposed between and separating the bottom polysilicon-comprising portion from the second silicon layer. The second insulator layer is further disposed between and separating the top polysilicon-comprising portion from the second silicon layer. In some embodiments, the top polysilicon-comprising portion has a first boron concentration, the bottom polysilicon-comprising portion has a second boron concentration, and the first boron concentration is less than the second boron concentration. In some embodiments, the first boron concentration decreases from an interface between the top polysilicon-comprising portion and the bottom polysilicon-comprising portion to a topmost surface of the top polysilicon-comprising portion. In some embodiments, the first boron concentration at the topmost surface of the top polysilicon-comprising portion is less than about $6 \times 10^{18}$ atoms/cm$^3$. In some embodiments, a total depth of the multilayer polysilicon-comprising isolation structure is a sum of a first thickness of the top polysilicon-comprising portion and a second thickness of the bottom polysilicon-comprising portion, where the first thickness is less than the second thickness.

In some embodiments, the bottom polysilicon-comprising portion includes a first bottom polysilicon-comprising portion and a second bottom polysilicon-comprising portion. The first bottom polysilicon-comprising portion is disposed between the second bottom polysilicon-comprising portion and the top polysilicon-comprising portion. In such embodiments, the top polysilicon-comprising portion can have a first boron concentration, the first bottom polysilicon-comprising portion can have a second boron concentration, and the second bottom polysilicon-comprising portion can have a third boron concentration, where the first boron concentration is less than the second boron concentration and the first boron concentration is less than the third boron concentration. In some embodiments, the second boron concentration of the first bottom polysilicon-comprising portion is less than the third boron concentration of the second bottom polysilicon-comprising portion. In some embodiments, the bottom polysilicon-comprising portion includes dopants and the top polysilicon-comprising portion is free of dopants. In some embodiments, the top polysilicon-comprising portion includes a first top polysilicon-comprising portion and a second top polysilicon-comprising portion. The first top polysilicon-comprising portion is disposed between the second top polysilicon-comprising portion and the bottom polysilicon-comprising portion. The first top polysilicon-comprising portion and the bottom polysilicon-comprising portion are doped layers, and the second top polysilicon-comprising portion is a non-doped layer. In some embodiments, a first width of a top end of the multilayer polysilicon-comprising isolation structure is greater than a second width of a bottom end of the multilayer polysilicon-comprising isolation structure. In some embodiments, the first width is tapered. In some embodiments, the second width is tapered. In some embodiments, the multilayer polysilicon-comprising isolation structure extends partially through the first silicon layer of the silicon-on-insulator substrate.

Another exemplary method includes providing a silicon-on-insulator substrate that includes a first silicon layer, a second silicon layer disposed over the first silicon layer, and a first insulator layer disposed between the first silicon layer and the second silicon layer. The method further includes forming an isolation trench in the silicon-on-insulator substrate. The isolation trench extends through the second silicon layer and the first insulator layer of the silicon-on-insulator substrate to the first silicon layer of the silicon-on-insulator substrate. The method further includes forming a second insulator layer that partially fills the isolation trench and forming a multilayer polysilicon-comprising isolation structure over the second insulator layer. The multilayer polysilicon-comprising isolation structures fills a remainder of the isolation trench and surrounds and isolates an active device region. In some embodiments, forming the multilayer polysilicon-comprising isolation structure includes performing a selective deposition process to form a first silicon-comprising layer over the first silicon layer of the silicon-on-insulator substrate and the second insulator layer and performing a non-selective deposition process to form a second silicon-comprising layer over the first silicon-comprising layer and the second insulator layer. The first silicon-comprising layer fills a lower portion of the remainder of the isolation trench, and the second silicon-comprising layer fills an upper portion of the remainder of the isolation trench. The method further includes forming a device in the active device region. In some embodiments, parameters of the selective deposition process are tuned to promote growth of the first silicon-comprising layer from the first silicon layer of the silicon-on-insulator substrate. In some embodiments, performing the selective deposition process includes using a deposition precursor and an etching precursor and performing the non-selective deposition process includes using only the deposition precursor. In some embodiments, performing the selective deposition process further includes using a dopant precursor. In some embodiments, the selective deposition process and the non-selective deposition process are performed in-situ. In some embodiments, forming the multilayer polysilicon-comprising isolation structure further includes performing a planarization process to remove the second silicon-comprising layer from over a top surface of the silicon-on-insulator substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   receiving a semiconductor-on-insulator substrate that includes a first semiconductor layer, an insulator layer disposed over the first semiconductor layer, and a second semiconductor layer disposed over the insulator layer;
   forming an isolation trench in the semiconductor-on-insulator substrate, wherein the isolation trench extends through the second semiconductor layer and the insulator layer to expose the first semiconductor layer of the semiconductor-on-insulator substrate;
   performing a selective deposition process to form a monocrystalline silicon layer that fills a bottom portion of the isolation trench; and
   performing a non-selective deposition process to form a polysilicon layer that fills a top portion of the isolation trench.

2. The method of claim 1, wherein the selective deposition process and the non-selective deposition process are performed in-situ.

3. The method of claim 1, wherein the performing the selective deposition process includes using a silicon-containing precursor and an etchant-containing precursor and the performing the non-selective deposition process includes using the silicon-containing precursor but not the etchant-containing precursor.

4. The method of claim 3, wherein the performing the selective deposition process includes using a dopant-containing precursor and the performing the non-selective deposition process includes using the dopant-containing precursor.

5. The method of claim 4, further comprising tuning parameters of the non-selective deposition process to provide the polysilicon layer with a dopant-free portion.

6. The method of claim 4, further comprising tuning parameters of the non-selective deposition process to provide the polysilicon layer with a gradient dopant profile.

7. The method of claim 1, wherein the insulator layer is a first insulator layer and the method further comprises forming a second insulator layer along sidewalls of the isolation trench before performing the selective deposition process, such that the monocrystalline silicon layer fills a remainder of the bottom portion of the isolation trench and the polysilicon layer fills a remainder of the top portion of the isolation trench.

8. The method of claim 1, further comprising performing a planarization process after performing the non-selective deposition process.

9. A method comprising:
   receiving a semiconductor-on-insulator substrate that includes a first semiconductor layer, a second semiconductor layer disposed over the first semiconductor layer, and an insulator layer disposed between the first semiconductor layer and the second semiconductor layer; and
   forming an isolation structure that surrounds an active region of the semiconductor-on-insulator substrate, wherein the isolation structure extends through the second semiconductor layer and the insulator layer of the semiconductor-on-insulator substrate to the first semiconductor layer of the semiconductor-on-insulator substrate, and further wherein the isolation structure includes:

a first insulator sidewall spacer, a second insulator sidewall spacer, and a multilayer silicon-comprising isolation structure disposed between the first insulator sidewall spacer and the second insulator sidewall spacer, wherein the multilayer silicon-comprising isolation structure includes a top polysilicon portion disposed over a bottom monocrystalline silicon portion.

10. The method of claim 9, wherein the forming the isolation structure includes:

forming an isolation trench in the semiconductor-on-insulator substrate, wherein the isolation trench extends through the second semiconductor layer and the insulator layer to the first semiconductor layer;

performing a bottom-up deposition process to form the bottom monocrystalline silicon portion in a bottom portion of the isolation trench; and performing a blanket deposition process to form the top polysilicon portion in a top portion of the isolation trench.

11. The method of claim 9, wherein the forming the isolation structure includes performing a first chemical vapor deposition process to form the bottom monocrystalline silicon portion and performing a second chemical vapor deposition process to form the top polysilicon portion.

12. The method of claim 11, further comprising:

tuning first parameters of the first chemical vapor deposition process to achieve a monocrystalline silicon growth rate of at least 1 µm/minute; and tuning second parameters of the second chemical vapor deposition process to achieve a polysilicon growth rate of at least 0.1 µm/minute.

13. The method of claim 9, wherein the forming the isolation structure includes tuning parameters of a deposition process that forms the bottom monocrystalline silicon portion, such that the bottom silicon monocrystalline portion includes a first monocrystalline silicon layer having a first dopant concentration, a second monocrystalline silicon layer having a second dopant concentration, wherein the first dopant concentration is less than the second dopant concentration.

14. The method of claim 9, wherein the forming the isolation structure includes tuning parameters of a deposition process that forms the top polysilicon portion, such that the top polysilicon portion has a gradient dopant concentration.

15. The method of claim 9, wherein the forming the isolation structure includes tuning parameters of a deposition process that forms the top polysilicon portion, such that the top polysilicon portion has a dopant-free portion.

16. The method of claim 9, wherein the top polysilicon portion has a first thickness, the bottom monocrystalline silicon portion has a second thickness, and the second thickness is greater than the first thickness.

17. A method comprising:

receiving a semiconductor structure, wherein the semiconductor structure includes a first semiconductor layer, a dielectric layer over the first semiconductor layer, and a second semiconductor layer over the dielectric layer; and processing the semiconductor structure to form an isolation ring over the first semiconductor layer, wherein the dielectric layer and the second semiconductor layer each extend from a first inner sidewall of the isolation ring to a second inner sidewall of the isolation ring and further wherein the isolation ring has:

a dielectric ring, and a semiconductor ring disposed in the dielectric ring, wherein the semiconductor ring includes a top polysilicon portion over a bottom silicon portion, wherein the semiconductor ring is formed by:

forming a trench that extends through the second semiconductor layer and the dielectric layer, wherein the trench exposes the first semiconductor layer;

depositing monocrystalline silicon in a bottom of the trench without depositing the monocrystalline silicon in a top of the trench, wherein the monocrystalline silicon forms the bottom silicon portion of the semiconductor ring;

depositing polysilicon in the top of the trench over the monocrystalline silicon and over a top of the second semiconductor layer, wherein the polysilicon forms the top polysilicon portion of the semiconductor ring; and removing the polysilicon from over the top of the second semiconductor layer.

18. The method of claim 17, wherein:

the depositing the monocrystalline silicon includes performing a first chemical vapor deposition process tuned to achieve a first deposition rate; and the depositing the polysilicon includes performing a second chemical vapor deposition process tuned to achieve a second deposition rate different from the first deposition rate.

19. The method of claim 17, wherein further comprising lining sidewalls of the trench with dielectric spacers before depositing the monocrystalline silicon.

20. The method of claim 17, further comprising forming a high voltage device is over the second semiconductor layer.

* * * * *